(12) United States Patent
Cho et al.

(10) Patent No.: US 11,106,535 B2
(45) Date of Patent: Aug. 31, 2021

(54) ERROR CORRECTION CIRCUIT OF SEMICONDUCTOR MEMORY DEVICE AND SEMICONDUCTOR MEMORY DEVICE

(71) Applicant: SAMSUNG ELECTRONICS CO., LTD., Suwon-si (KR)

(72) Inventors: Sunghye Cho, Hwaseong-si (KR); Kijun Lee, Seoul (KR); Yeonggeol Song, Seoul (KR); Sungrae Kim, Seoul (KR); Chanki Kim, Ansan-si (KR); Myungkyu Lee, Seoul (KR); Sanguhn Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/926,000

(22) Filed: Jul. 10, 2020

(65) Prior Publication Data

US 2021/0224156 A1 Jul. 22, 2021

(30) Foreign Application Priority Data

Jan. 16, 2020 (KR) .......................... 10-2020-0005703

(51) Int. Cl.
*G06F 11/10* (2006.01)
*H03M 13/15* (2006.01)
*H03M 13/00* (2006.01)

(52) U.S. Cl.
CPC ..... *G06F 11/1076* (2013.01); *H03M 13/1575* (2013.01); *H03M 13/616* (2013.01)

(58) Field of Classification Search
CPC .......... G06F 11/1076; H03M 13/1575; H03M 13/616

See application file for complete search history.

(56) References Cited

U.S. PATENT DOCUMENTS

| | | | |
|---|---|---|---|
| 5,581,569 A * | 12/1996 | Tanuma | ................ H01S 3/042 372/41 |
| 5,754,753 A | 5/1998 | Smelser | |
| 8,631,304 B2 | 1/2014 | Lasser | |
| 8,694,872 B2 | 4/2014 | Goel | |
| 8,762,821 B2 | 6/2014 | Wu et al. | |
| 8,984,367 B2 | 3/2015 | Ekas et al. | |
| 9,336,078 B1 * | 5/2016 | Pagiamtzis | ............. G06F 11/10 |
| 9,786,387 B2 | 10/2017 | Cha et al. | |
| 2002/0157044 A1 * | 10/2002 | Byrd | .................... H04L 1/0057 714/703 |

(Continued)

*Primary Examiner* — Kyle Vallecillo
(74) *Attorney, Agent, or Firm* — Volentine, Whitt & Francos, PLLC

(57) ABSTRACT

An error correction circuit includes an error correction code (ECC) encoder and an ECC decoder. The ECC encoder generates, based on a main data, a parity data using an ECC represented by a generation matrix and stores a codeword including the main data and the parity data in a target page. The ECC decoder reads the codeword from the target page as a read codeword based on an externally provided address to generate different syndromes based on the read codeword and a parity check matrix which is based on the ECC, and applies the different syndromes to the main data in the read codeword to correct a single bit error when the single bit error exists in the main data or to correct two bit errors when the two bit errors occur in adjacent two memory cells in the target page.

20 Claims, 31 Drawing Sheets

(56) References Cited

U.S. PATENT DOCUMENTS

| | | | |
|---|---|---|---|
| 2007/0124557 A1* | 5/2007 | Kanai | G06F 11/1044 |
| | | | 711/164 |
| 2009/0106633 A1* | 4/2009 | Fujiwara | H03M 13/13 |
| | | | 714/785 |
| 2015/0007001 A1* | 1/2015 | Kern | H03M 13/616 |
| | | | 714/785 |
| 2015/0331732 A1 | 11/2015 | Giovannini et al. | |
| 2017/0077963 A1* | 3/2017 | Jung | G06F 11/1012 |
| 2020/0119754 A1* | 4/2020 | Kim | G06F 11/1012 |
| 2020/0266830 A1* | 8/2020 | Kim | H03M 13/3715 |
| 2020/0304149 A1* | 9/2020 | Zamir | H03M 13/1111 |
| 2020/0304155 A1* | 9/2020 | Jeong | G06F 11/1068 |
| 2020/0313693 A1* | 10/2020 | Jo | H03M 13/114 |
| 2020/0336156 A1* | 10/2020 | Kim | H03M 13/116 |
| 2020/0389186 A1* | 12/2020 | Kim | H03M 13/1108 |
| 2021/0036719 A1* | 2/2021 | Kim | H03M 13/152 |

\* cited by examiner

```
        PRT
  ┌──────────────┐
d129            d136
┌─┬─┬─┬─┬─┬─┬─┬─┐
│1│0│0│0│0│0│0│0│
├─┼─┼─┼─┼─┼─┼─┼─┤
│0│1│0│0│0│0│0│0│
├─┼─┼─┼─┼─┼─┼─┼─┤
│0│0│1│0│0│0│0│0│
├─┼─┼─┼─┼─┼─┼─┼─┤
│0│0│0│1│0│0│0│0│
├─┼─┼─┼─┼─┼─┼─┼─┤
│0│0│0│0│1│0│0│0│
├─┼─┼─┼─┼─┼─┼─┼─┤
│0│0│0│0│0│1│0│0│
├─┼─┼─┼─┼─┼─┼─┼─┤
│0│0│0│0│0│0│1│0│
├─┼─┼─┼─┼─┼─┼─┼─┤
│0│0│0│0│0│0│0│1│
└─┴─┴─┴─┴─┴─┴─┴─┘
 ↑ ↑   ...    ↑
PV1 PV2       PV8
 └────────────┘
      PCG
```

ERROR CORRECTION CIRCUIT OF SEMICONDUCTOR MEMORY DEVICE AND SEMICONDUCTOR MEMORY DEVICE

CROSS-REFERENCE TO RELATED APPLICATIONS

This U.S. nonprovisional patent application claims priority under 35 U.S.C. § 119 to Korean Patent Application No. 10-2020-0005703, filed on Jan. 16, 2020 in the Korean Intellectual Property Office, the disclosure of which is incorporated by reference herein in its entirety.

TECHNICAL FIELD

Example embodiments of the present disclosure relate to memory devices. More particularly, example embodiments of the present disclosure relate to error correction circuits of semiconductor memory devices.

DISCUSSION OF THE RELATED ART

Semiconductor memory devices may be classified as non-volatile memory devices, such as flash memory devices, and volatile memory devices, such as dynamic random access memory (DRAM) devices. DRAM devices are often used for system memories due to their high speed operation and cost efficiency. Due to the continuing reduction in fabrication design rules of DRAM devices, bit errors of memory cells in DRAM devices may increase, and the yield of DRAM devices may decrease.

SUMMARY

Some example embodiments of the present disclosure provide an error correction circuit of a semiconductor memory device that may result in enhanced performance and reliability.

Some example embodiments of the present disclosure provide a semiconductor memory device with enhanced performance and reliability.

According to some example embodiments, an error correction circuit of a semiconductor memory device includes an error correction code (ECC) encoder and an ECC decoder. The ECC encoder generates, based on a main data, a parity data using an ECC represented by a generation matrix and stores a codeword including the main data and the parity data in a target page of a memory cell array. The ECC decoder reads the codeword from the target page as a read codeword based on an address provided from outside the semiconductor memory device to generate different syndromes based on the read codeword and a parity check matrix which is based on the ECC, and applies the different syndromes to the main data in the read codeword to correct a single bit error when the single bit error exists in the main data or to correct two bit errors when the two bit errors occur in adjacent two memory cells in the target page.

According to some example embodiments, a semiconductor memory device includes a memory cell array, an error correction circuit and a control logic circuit. The memory cell array includes a plurality of volatile memory cells connected to word-lines and bit-lines. The error correction circuit generates, based on a main data, a parity data using an ECC represented by a generation matrix, stores a codeword including the main data and the parity data in a target page of the memory cell array, reads the codeword from the target page as a read codeword based on an address provided from outside the semiconductor memory device to generate different syndromes based on the read codeword and a parity check matrix which is based on the ECC, and applies the different syndromes to the main data in the read codeword to correct a single bit error when the single bit error exists in the main data or to correct two bit errors when the two bit errors occur in adjacent two memory cells in the target page. The control logic circuit controls the error correction circuit based on a command and the address provided from outside the semiconductor memory device.

According to some example embodiments, a semiconductor memory device includes a memory cell array, an error correction circuit and a control logic circuit. The memory cell array includes a plurality of volatile memory cells connected to word-lines and bit-lines. The error correction circuit generates, based on a main data, a parity data using an ECC represented by a generation matrix, stores a codeword including the main data and the parity data in a target page of the memory cell array, reads the codeword from the target page as a read codeword based on an address provided from outside the semiconductor memory device to generate different syndromes based on the read codeword and a parity check matrix which is based on the ECC, and applies the different syndromes to the main data in the read codeword to correct a single bit error when the single bit error exists in the main data or to correct two bit errors when the two bit errors occur in adjacent two memory cells in the target page. The control logic circuit controls the error correction circuit based on a command and the address provided from outside the semiconductor memory device. The error correction circuit includes an ECC decoder which generates the different syndromes based on a parity check matrix which is based on the ECC. The ECC decoder generates a first sub check matrix and a second sub check matrix, and applies one of the first sub check matrix and the second sub check matrix to the read codeword based on a least significant bit (LSB) of a row address of the address to generate at least one syndrome for correcting the two bit errors.

According to some example embodiments, the error correction circuit and the semiconductor memory device including the error correction circuit may correct the single bit error and the two bit errors by applying different syndromes to the single bit error and the two bit errors by using the parity check matrix which is based on the ECC, and thus may increase efficiency of error correcting.

BRIEF DESCRIPTION OF THE DRAWINGS

The above and other features of the present disclosure will become more apparent by describing in detail example embodiments thereof with reference to the accompanying drawings.

Figure 16D:
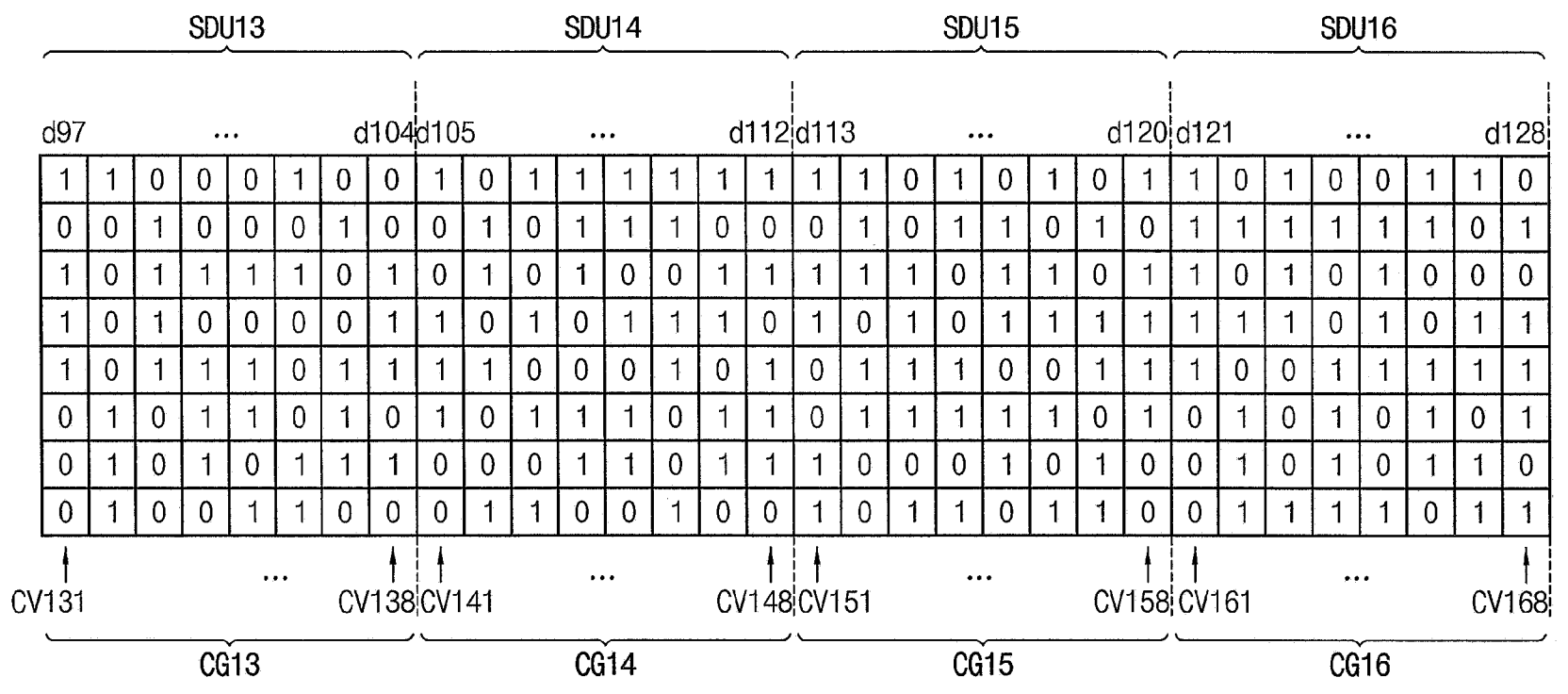

FIGS. 16A, 16B, 16C, 16D and 16E illustrate an example of the parity check matrix of FIG. 15.

FIGS. 17A and 17B illustrate an example of the first sub check matrix which is generated by using the parity check matrix.

FIGS. 18A and 18B illustrate an example of the second sub check matrix which is generated by using the parity check matrix.

DETAILED DESCRIPTION OF THE EMBODIMENTS

Figure 1:
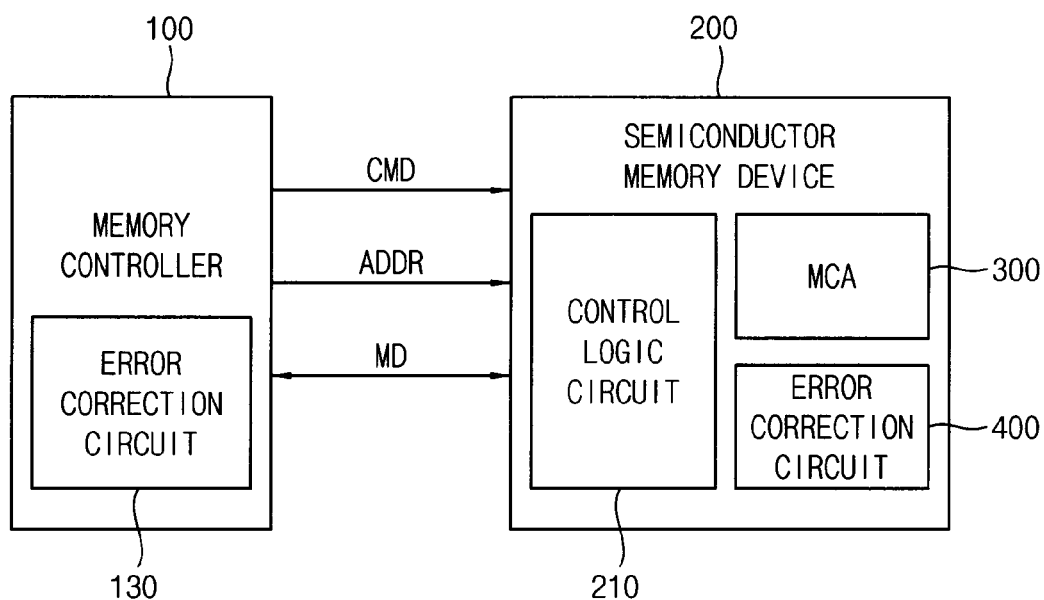
FIG. 1 is a block diagram illustrating a memory system according to some example embodiments.

Example embodiments of the present disclosure will be described more fully hereinafter with reference to the accompanying drawings Like reference numerals may refer to like elements throughout the accompanying drawings.

FIG. 1 is a block diagram illustrating a memory system according to example embodiments of the present disclosure.

Referring to FIG. 1, a memory system 20 may include a memory controller 100 (e.g., an external memory controller) and a semiconductor memory device 200.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In example embodiments, the semiconductor memory device 200 is a memory device including a plurality of dynamic (volatile) memory cells such as a dynamic random access memory (DRAM), DDR5 (double data rate) synchronous DRAM (SDRAM), DDR6 (double data rate) synchronous DRAM (SDRAM) or a stacked memory device. An example of a stacked memory device in some embodiments is a high bandwidth memory (HBM).

The memory controller 100 transmits a command CMD, and an address (signal) ADDR to the semiconductor memory device 200 and exchanges main data MD with the semiconductor memory device 200. Although not illustrated in FIG. 1, the memory controller 100 may transmit a clock signal to the semiconductor memory device 200.

The memory controller 100 may include an error correction circuit 130. As explained below, the semiconductor memory device 200 may include an error correction circuit 130, so the error correction circuit 130 in the memory controller 100 may be referred to as a second error correction circuit. The error correction circuit 130 may generate, based on the main data MD to be transmitted to the semiconductor memory device 200, a parity data. The error correction circuit 130 may store the parity data, may generate check bits based on the main data MD when the main data MD is received from the semiconductor memory device 200 and may correct error bits in the main data MD received from the semiconductor memory device 200 based on a comparison of the parity data and the check bits.

The semiconductor memory device 200 includes a memory cell array 300 that stores the main data MD, an error correction circuit 400 and a control logic circuit 210. The error correction circuit 400 may be referred to as a first error correction circuit since, as noted above, an error correction circuit 130 in the memory controller 100 may be referred to as a second error correction circuit. The memory cell array 300 includes a plurality of sub array blocks arranged in a first direction and a second direction crossing the first direction. For example, the sub array blocks may be arranged in a three-dimensional configuration in which the first direction is perpendicular to a second plane that includes the second direction, and the second direction is perpendicular to a first plane that includes the first direction.

A generation matrix may represent the ECC as a structure/data format in a matrix form. The generation matrix may include, for example, a plurality of column vectors, and the column vectors may be divided into groups. The error correction circuit 400 may generate a parity data using an ECC which is represented by the generation matrix. The groups of column vectors of the generation matrix may include, for example, a plurality of code groups corresponding to sub data units of the main data MD and the parity data. The error correction circuit 400 may generate the parity data by performing an ECC encoding on the main data MD and may detect and/or correct at least one error bit in the main data MD read from the memory cell array 300 using the parity data by performing an ECC decoding on the main data MD.

The error correction circuit 400 may include an ECC decoder. The ECC decoder in an the error correction circuit 400 may be configured to read data (e.g., a codeword) from a target page in the memory cell array 300. The ECC decoder in the error correction circuit 400 may be configured to read the codeword from the target page in the memory cell array 300 based on an address provided from outside the semiconductor memory device 200 to generate at least one syndrome. A syndrome is an indication of whether an error occurs in a read codeword, and conventionally this is shown when a syndrome calculation results in a non-zero result showing a difference between, for example, the original main data MD in a codeword to be stored and the main data MD in the read codeword. The ECC decoder may generate a syndrome based on data (e.g., the codeword) read from the memory cell array 300 and may correct at least one error bit in the read data based on the syndrome by applying different syndromes to a single bit error in the read data when the single bit error exists in the read data and two bit errors occurring in adjacent two memory cells in a target page when the two bit errors occur in the adjacent two memory cells in the target page. The ECC decoder may generate the different syndromes using a parity check matrix which is based on the ECC. A parity check matrix is explained in detail later with respect to, for example, FIGS. 16A, 16B, 16C, 16D and 16E. The parity check matrix may include multiple code groups corresponding to multiple sub data units along with a code group corresponding to parity bits.

The main data MD includes a plurality of data bits, and the plurality of data bits may be divided into a plurality of sub data units. The ECC may include a plurality of column vectors divided into a plurality of code groups corresponding to the sub data units and the parity data.

The semiconductor memory device 200 may perform a burst operation. Herein, the burst operation refers to an operation of writing or reading a large amount of data by sequentially increasing or decreasing an initial address provided from the memory controller 100. A basic unit of the burst operation may be referred to as a burst length BL. In example embodiments, the burst length BL refers to the number of operations of continuously reading or writing data by sequentially increasing or decreasing an initial address. The main data MD in the memory system 20 of FIG. 1 may correspond to multiple burst lengths.

Figure 2:
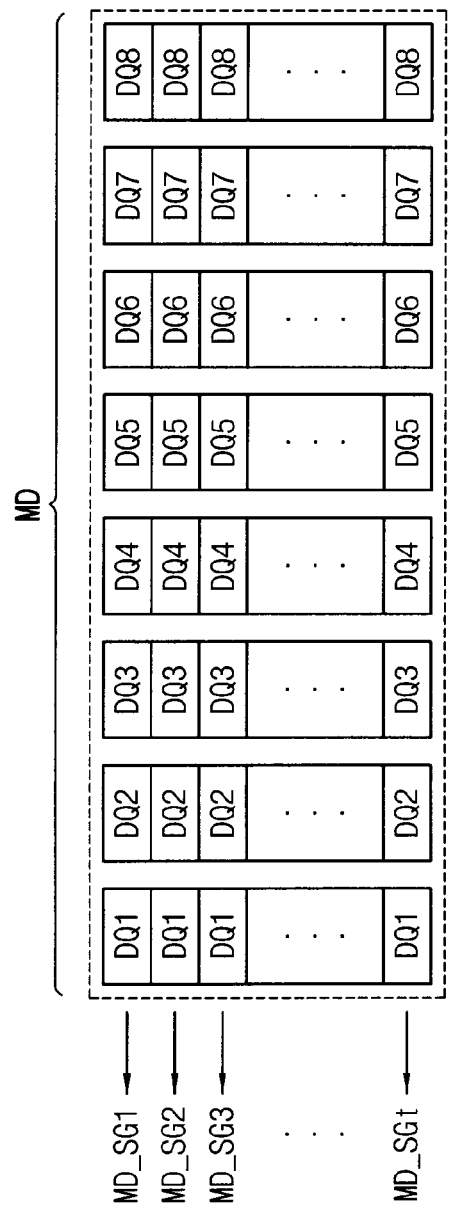
FIG. 2 illustrates a main data corresponding to the plurality of burst lengths in the memory system of FIG. 1, according to some example embodiments.

FIG. 2 illustrates a main data corresponding to the plurality of burst lengths in the memory system of FIG. 1 according to some example embodiments.

Referring to FIG. 2, the main data MD corresponding to the plurality of burst lengths are input to/output from the semiconductor memory device 200. The main data MD includes data segments MD_SG1~MD_SGt (t is a natural number equal to or greater than 8) each corresponding to a burst length among the plurality of burst lengths. The burst length is assumed to be 8 in FIG. 2. However, example embodiments are not limited thereto. The main data MD corresponding to the plurality of burst lengths may be stored in the memory cell array 300 of the semiconductor memory device 200.

Figure 3:
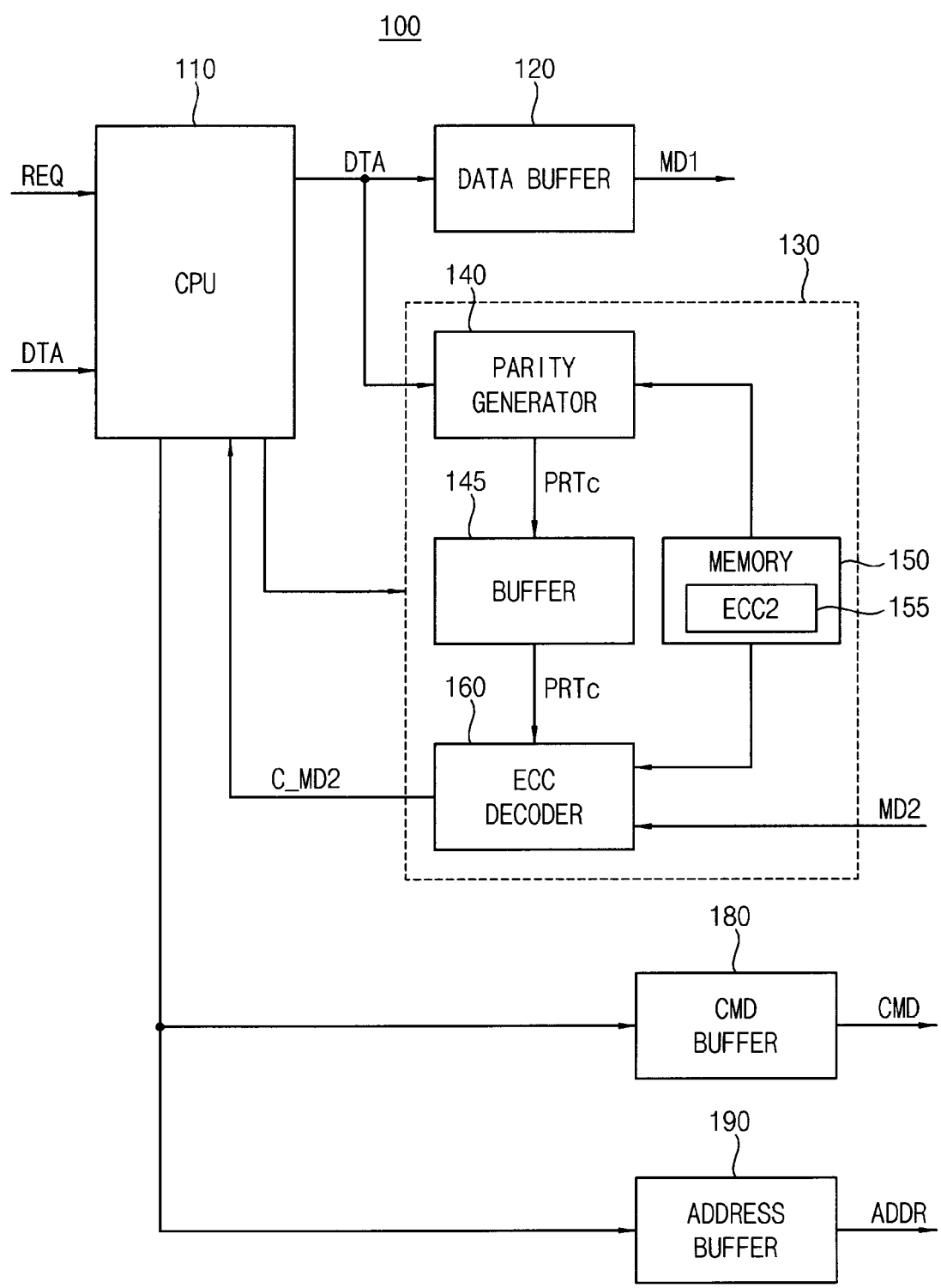
FIG. 3 is a block diagram illustrating an example of the memory controller in FIG. 1 according to some example embodiments.

FIG. 3 is a block diagram illustrating an example of the memory controller in FIG. 1 according to some example embodiments.

Referring to FIG. 3, the memory controller 100 may include a CPU 110 (central processing unit), a data buffer 120, the error correction circuit 130, a command buffer 180 and an address buffer 190. The error correction circuit 130 may include a parity generator 140, a buffer 145, a memory 150 that stores a second ECC (ECC2) 155, and an ECC decoder 160.

The CPU 110 receives a request REQ and a data DTA from the host, and provides the data DTA to the data buffer 120 and the parity generator 140.

The data buffer 120 buffers the data DTA to provide a first main data MD1 to the semiconductor memory device 200.

The parity generator 140 is connected to the memory 150, performs an ECC encoding on the data DTA using the second ECC 155 to generate a system parity data PRTc and stores the system parity data PRTc in the buffer 145.

The ECC decoder 160, in a read operation of the semiconductor memory device 200, receives a second main data MD2 from the semiconductor memory device 200. The ECC decoder 160 performs an ECC decoding on the second main data MD2 by using the second ECC 155 and the system parity data PRTc and may provide a corrected main data C_MD2 to the CPU 110. The CPU 110 provides the corrected main data C_MD2 to the host.

The command buffer 180 stores the command CMD corresponding to the request REQ and transmits the command CMD to the semiconductor memory device 200 under control of the CPU 110. The address buffer 190 stores the address ADDR and transmits the address ADDR to the semiconductor memory device 200 under control of the CPU 110.

Figure 4:
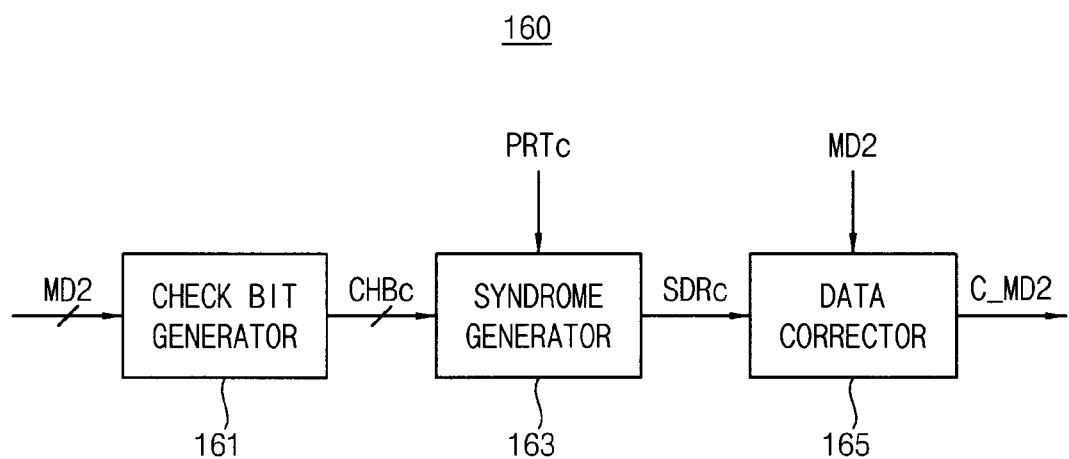
FIG. 4 is a block diagram illustrating an example of the ECC decoder in FIG. 3 according to some example embodiments.

FIG. 4 is a block diagram illustrating an example of the ECC decoder in FIG. 3 according to some example embodiments.

Referring to FIG. 4, the ECC decoder 160 may include a check bit generator 161, a syndrome generator 163 and a data corrector 165.

The check bit generator 161 receives the second main data MD2, and generates check bits CHBc corresponding to the second main data MD2 using the second ECC 155.

The syndrome generator 163 compares the system parity data PRTc and the check bits CHBc based on symbols to generate a syndrome data SDRc. The syndrome data SDRc indicates whether the second main data MD2 includes at least one error bit as well as a position of the at least one error bit.

The data corrector 165 receives the second main data MD2 and corrects the at least one error bit in the second main data MD2 based on the syndrome data SDRc to output the corrected main data C_MD2.

Figure 5:
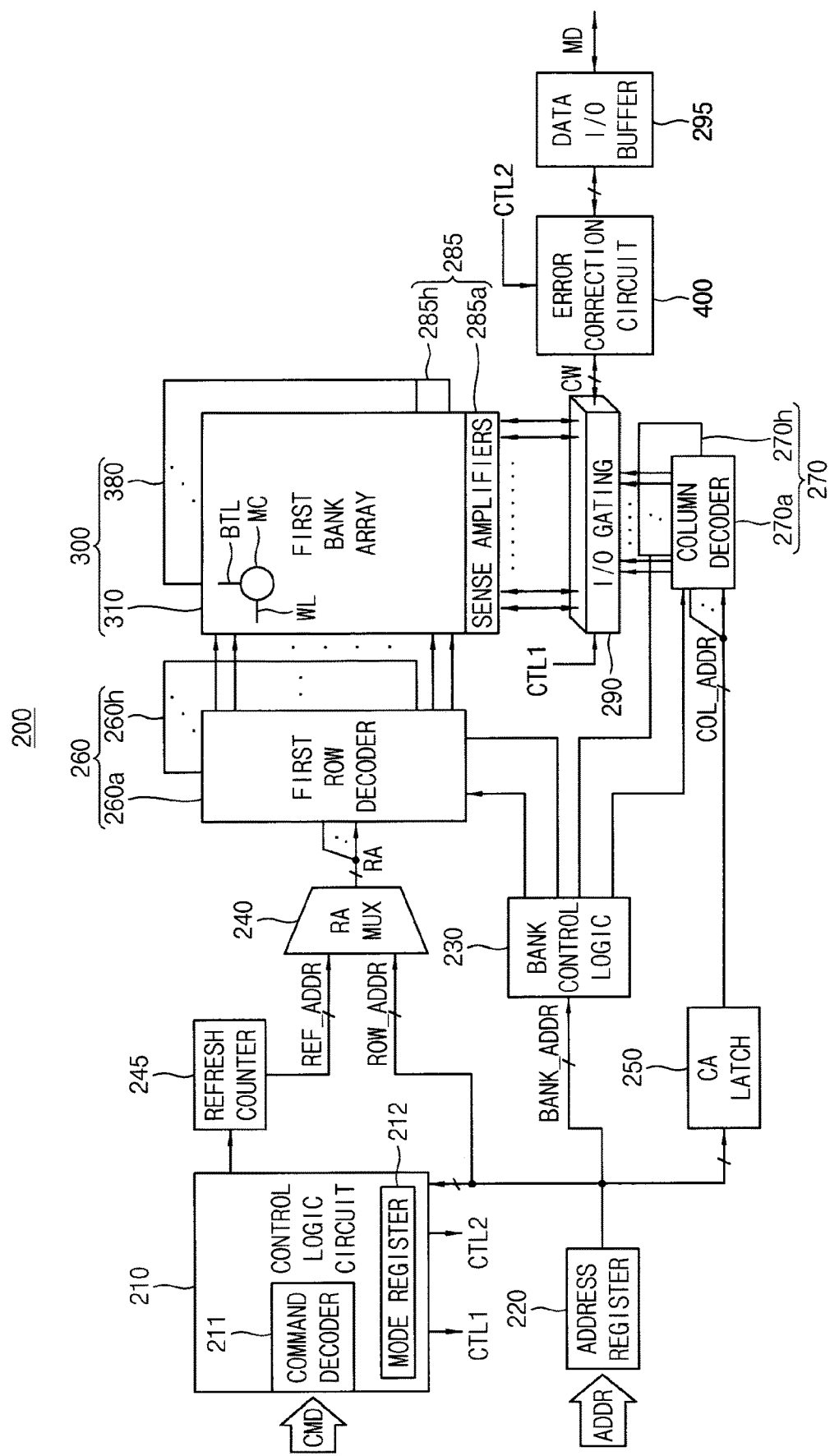
FIG. 5 is a block diagram illustrating the semiconductor memory device in FIG. 1 according to some example embodiments of the present disclosure.

FIG. 5 is a block diagram illustrating the semiconductor memory device in FIG. 1 according to some example embodiments of the present disclosure.

Referring to FIG. 5, the semiconductor memory device 200 includes a control logic circuit 210, an address register 220, a bank control logic 230, a row address multiplexer 240, a column address latch 250, a row decoder 260, a column decoder 270, a memory cell array 300, a sense amplifier unit 285, an I/O gating circuit 290 (input/output gating circuit), a data I/O buffer 295 (data input/output buffer), a refresh counter 245, and an error correction circuit 400.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. In addition, each of the first through eighth bank arrays 310~380 may be divided into a plurality of sub array blocks arranged in a first direction and a second direction such as a horizontal direction and a vertical direction or such as a depth direction and a vertical direction.

Each of the first through eighth bank arrays 310~380 includes a plurality of memory cells MC coupled to word-lines WL and bit-lines BTL.

Although the semiconductor memory device 200 is illustrated in FIG. 5 as including eight banks, example embodiments of the present disclosure are not limited thereto, and the semiconductor memory device 200 may include any number of banks.

The control logic circuit 210 receives a command CMD from the memory controller 100. The address register 220 receives an address ADDR including a bank address BANK_ADDR, a row address ROW_ADDR and a column address COL_ADDR from the memory controller 100.

The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR and the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR received from the column address latch 250. The activated one of the first through eighth bank column decoders 270a~270h may alternatively control the I/O gating circuit 290 to output data corresponding to a mapped column address MCA.

The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the codeword is to be read, and may be stored in the read data latches. The codeword CW stored in the read data latches is ECC-decoded by the error correction circuit 400 and may be provided to the memory controller 100 via the data I/O buffer 295.

Data (or the main data) MD to be written in one bank array of the first through eighth bank arrays 310~380 may be provided to the data I/O buffer 295 from the memory controller 100. The main data MD is provided to the error correction circuit 400.

The error correction circuit 400 performs ECC encoding on the main data MD to generate a parity data, and provides the I/O gating circuit 290 with the codeword CW including the main data MD and the parity data. The control logic circuit 210 is configured to control the I/O gating circuit 290 such that the sub data units of the main data MD and the parity data are stored in target sub array blocks among the sub array blocks. The I/O gating circuit 290 may store the main data MD and the parity data in a target page based on a first control signal CTL1 from the control logic circuit 210. In addition, the error correction circuit 400 performs ECC decoding on the main data read from the target page based on the parity data read from the target page.

When the error correction circuit 400 performs the ECC encoding and the ECC decoding, the error correction circuit 400 may use a first ECC which is represented by a generation matrix. For example, the data structure/data format of the first ECC may be a generation matrix. The first ECC may include a plurality of column vectors corresponding to data bits of the data (or main data) MD and parity bits of the parity data, and the column vectors may be divided into a plurality of code groups corresponding to a plurality of sub data units and the parity data. The data bits may be divided into the plurality of sub data units.

The error correction circuit 400 reads the codeword CW from the target page to generate at least one syndrome and corrects at least one error bit in the read codeword by applying different syndromes to a single bit error in the read codeword. When two bit errors in the read codeword occur in adjacent two memory cells in the target page, the error correction circuit corrects the two bit errors in the read codeword. The error correction circuit 400 generates the different syndromes using one parity check matrix which is based on the first ECC.

Therefore, the error correction circuit 400 may correct the single bit error or the two bit errors in the main data.

The control logic circuit 210 may control operations of the semiconductor memory device 200. For example, the control logic circuit 210 may generate control signals for the semiconductor memory device 200 to perform a write operation or a read operation. The control logic circuit 210 may include a command decoder 211 that decodes the command CMD received from the memory controller 100, and a mode register 212 that sets an operation mode of the semiconductor memory device 200. That is, the control logic circuit 210 is configured to control the semiconductor memory device 200 based on the command CMD and the address received from outside the semiconductor memory device 200. More specifically, the control logic circuit 210 is configured to control elements of the semiconductor memory device 200 such as the error correction circuit 400 based on a command and the address received from outside the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, and a second control signal CTL2 to control the error correction circuit 400.

Figure 6:
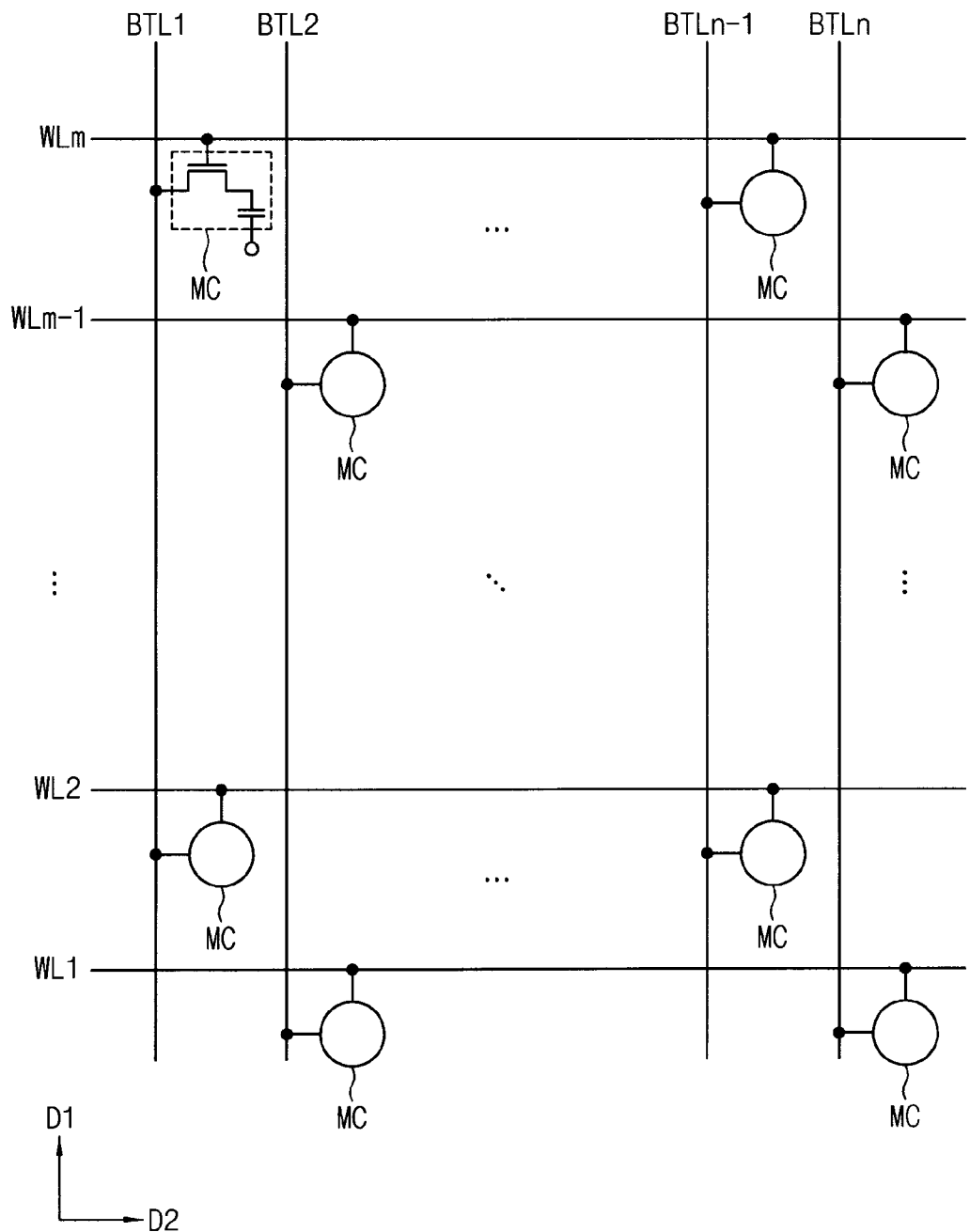
FIG. 6 illustrates an example of the first bank array in the semiconductor memory device of FIG. 5 according to some example embodiments.

FIG. 6 illustrates an example of the first bank array in the semiconductor memory device of FIG. 5 according to some example embodiments.

Referring to FIG. 6, the first bank array 310 includes a plurality of word-lines WL1~WLm (where m is a natural number greater than two), a plurality of bit-lines BTL1~BTLn (where n is a natural number greater than two), and a plurality of memory cells MCs disposed at intersections between the word-lines WL1~WLm and the bit-lines BTL1~BTLn. Each of the memory cells MCs includes an access (cell) transistor coupled to one of the word-lines WL1~WLm and one of the bit-lines BTL1~BTLn and a storage (cell) capacitor coupled to the cell transistor. That is, each of the memory cells MCs has a DRAM cell structure.

Figure 7:
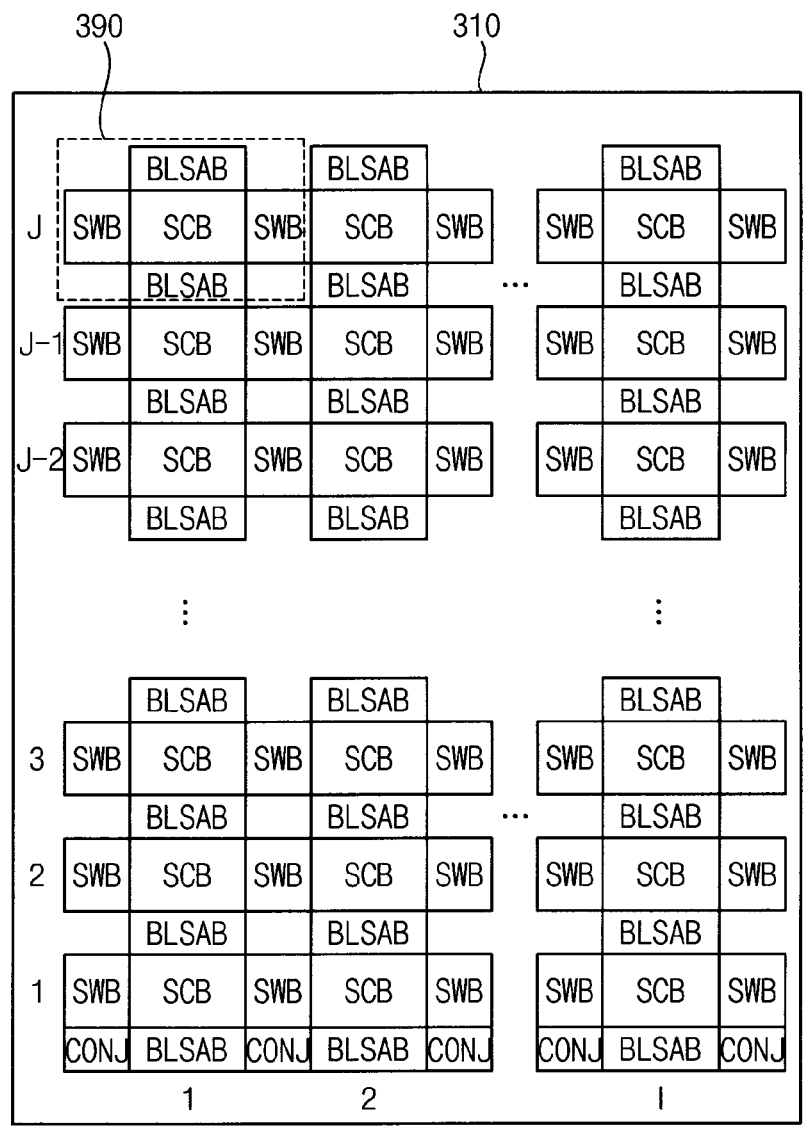
FIG. 7 illustrates an example of the first bank array in the semiconductor memory device of FIG. 5 according to some example embodiments.
Figure 7:

FIG. 7 illustrates an example of the first bank array in the semiconductor memory device of FIG. 5 according to some example embodiments.

Referring to FIG. 7, in the first bank array 310, I sub-array blocks SCB may be disposed in the second direction D2, and J sub-array blocks SCB may be disposed in the first direction D1 substantially perpendicular to the second direction D2. I and J represent a number of the sub-array blocks SCB in the second direction and the first direction, respectively, and are natural numbers greater than two. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the second direction D2 as well on each side of each of the sub-array blocks SCB in the second direction D2. Sub word-line drivers may be disposed in the sub word-line driver regions SWB. J+1 bit-line sense amplifier regions BLSAB may be disposed, for example between the sub-array blocks SCB in the first direction D1 and above and below each of the sub-array blocks SCB in the first direction D1. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. A voltage generator is disposed in each of the conjunction regions CONJ. A portion 390 in the first bank array 310 may be described with reference to FIG. 8 below.

Figure 8:
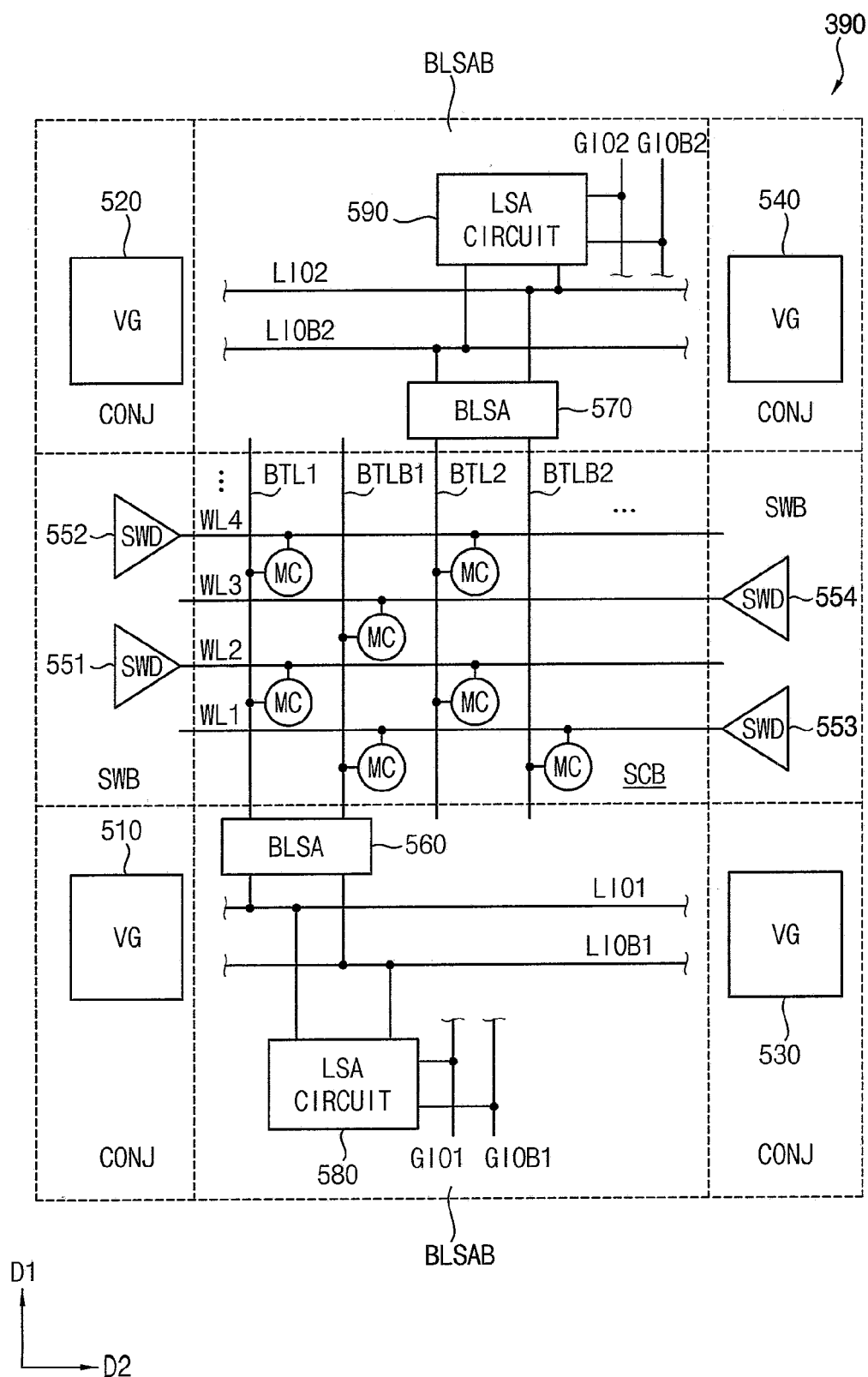
FIG. 8 illustrates a portion of the first bank array in FIG. 7 according to some example embodiments.

FIG. 8 illustrates a portion of the first bank array in FIG. 7 according to some example embodiments.

Referring to FIGS. 7 and 8, in the portion 390 of the first bank array 310, the sub-array block SCB, two of the bit-line sense amplifier regions BLSAB, two of the sub word-line driver regions SWB and four of the conjunction regions CONJ are disposed.

The sub-array block SCB includes a plurality of word-lines WL1~WL4 extending in a row direction (the second direction D2) and a plurality of bit-line pairs BTL1~BTLB1 and BTL2~BTLB2 extending in a column direction (the first direction D1). The sub-array block SCB includes a plurality of memory cells MCs disposed at intersections of the word-lines WL1~WL4 and the bit-line pairs BTL1~BTLB1 and BTL2~BTLB2.

With reference to FIG. 8, the sub word-line driver regions SWB include a plurality of sub word-line drivers 551, 552, 553 and 554 that respectively drive the word-lines WL1~WL4. The sub word-line drivers 551 and 552 may be disposed in the sub word-line driver region SWB, which is leftward (in this example), with respect to the sub-array block SCB. In addition, the sub word-line drivers 553 and 554 may be disposed in the sub word-line driver region SWB, which is rightward (in this example), with respect to the sub-array block SCB.

The bit-line sense amplifier regions BLSAB include bit-line sense amplifiers 560 (BLSA) and bit-line sense amplifier 570 coupled to the bit-line pairs BTL1~BTLB1 and BTL2~BTLB2, and local sense amplifier circuit 580 and local sense amplifier circuit 590. The bit-line sense amplifier 560 may sense and amplify a voltage difference between the bit-line pair BTL1 and BTLB1 to provide the amplified voltage difference to a local I/O line pair LIO1 and LIOB1.

The local sense amplifier circuit 580 controls connection between the local I/O line pair LIO1 and LIOB1 and a global I/O line pair GIO1 and GIOB1. The local sense amplifier circuit 590 controls connection between the local I/O line pair LIO2 and LIOB2 and a global I/O line pair GIO2 and GIOB2.

As illustrated in FIG. 8, the bit-line sense amplifier 560 and the bit-line sense amplifier 570 may be alternately disposed at an upper portion and a lower portion of the sub-array block SCB. The conjunction regions CONJ are disposed adjacent to the bit-line sense amplifier regions BLSAB and the sub word-line driver regions SWB. The conjunction regions CONJ are also disposed at each corner of the sub-array block SCB in FIG. 8. A plurality of voltage generators 510, 520, 530 and 540 may be disposed in the conjunction regions CONJ.

Figure 9:
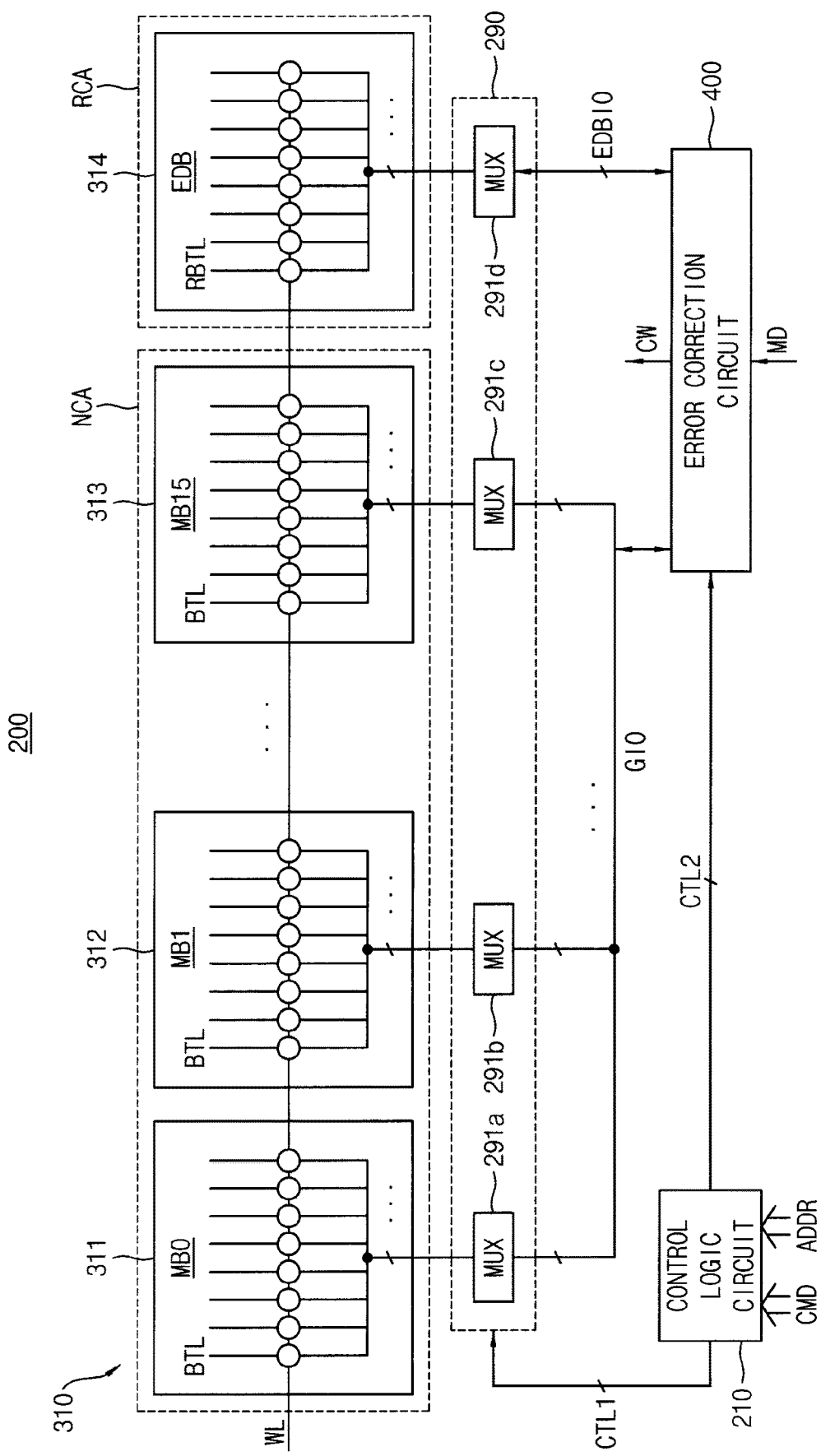
FIG. 9 illustrates a portion of the semiconductor memory device of FIG. 5 in a write operation.

FIG. 9 illustrates a portion of the semiconductor memory device of FIG. 5 in a write operation.

In FIG. 9, the control logic circuit 210, the first bank array 310, the I/O gating circuit 290, and the error correction circuit 400 are illustrated.

Referring to FIG. 9, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells. The first memory blocks 311~313 and the second memory block 314 may each be representative of a sub array block SCB in FIG. 7.

The I/O gating circuit 290 includes a plurality of switching circuits 291a~291d respectively connected to the first memory blocks 311~313 and the second memory block 314.

The error correction circuit 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the error correction circuit 400.

When the command CMD is a write command, the control logic circuit 210 provides the second control signal CTL2 to the error correction circuit 400. The error correction circuit 400 performs the ECC encoding on the main data MD to generate parity data associated with the main data MD and provides the I/O gating circuit 290 with the codeword CW including the main data MD and the parity data. The control logic circuit 210 provides the first control signal CTL1 to the I/O gating circuit 290 such that the codeword CW is to be stored in a sub-page of the target page in the first bank array 310.

Figure 10:
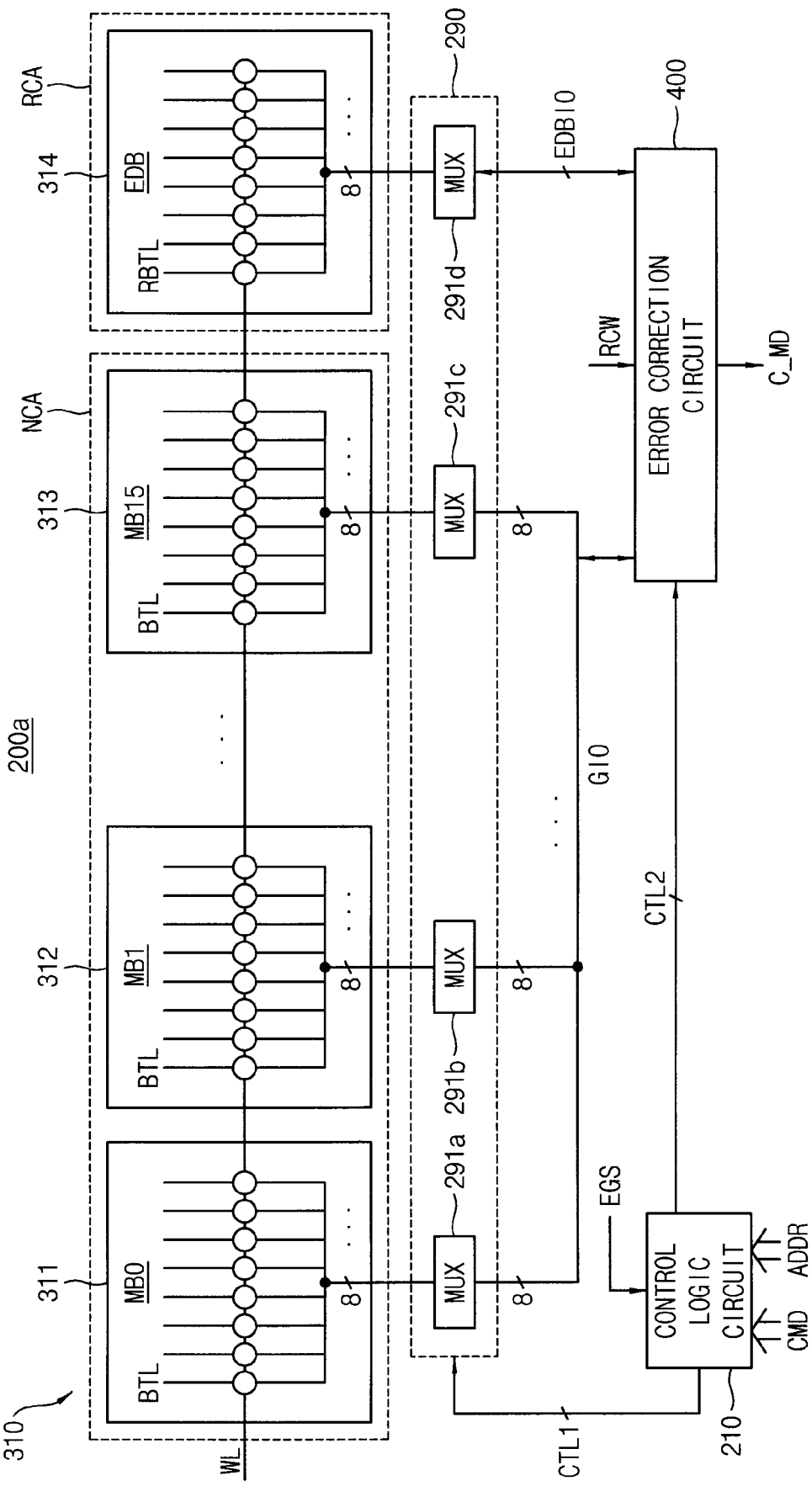
FIG. 10 illustrates a portion of the semiconductor memory device of FIG. 5 in a read operation.

FIG. 10 illustrates a portion of the semiconductor memory device of FIG. 5 in a read operation.

Referring to FIG. 10, when the command CMD is a read command (a second command) to designate a read operation, the control logic circuit 210 provides the first control signal CTL1 to the I/O gating circuit 290 such that a (read) codeword RCW stored in the sub-page of the target page in the first bank array 310 is provided to the error correction circuit 400.

The error correction circuit 400 performs ECC decoding on the read codeword RCW to correct the single bit error or two bit errors in the read codeword RCW by applying different syndromes to the single bit error and the two bit errors and outputs the corrected main data C_MD.

Figure 11:
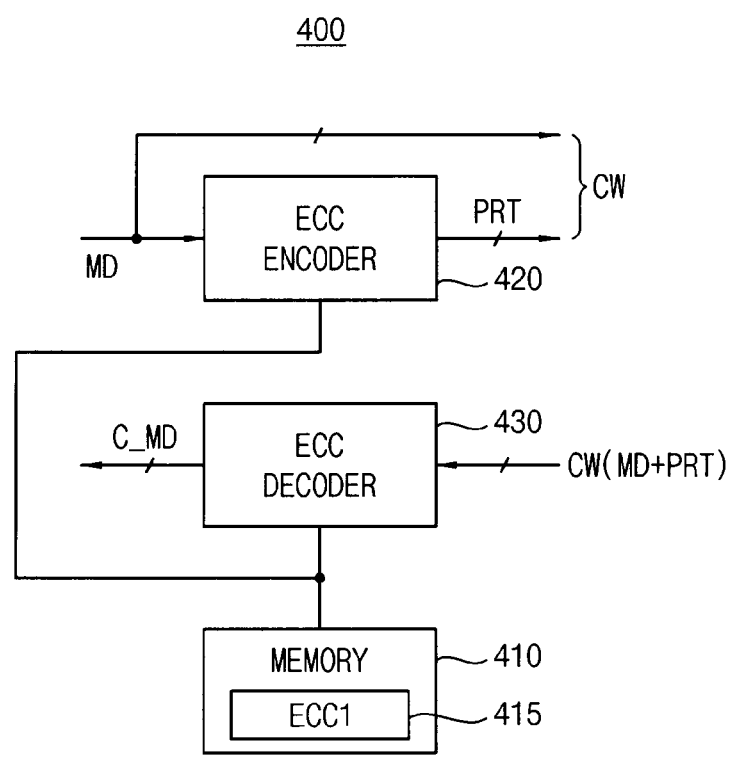
FIG. 11 is a block diagram illustrating an example of the error correction circuit in the semiconductor memory device of FIG. 5 according to some example embodiments.

FIG. 11 is a block diagram illustrating an example of the error correction circuit in the semiconductor memory device of FIG. 5 according to some example embodiments.

Referring to FIG. 11, the error correction circuit 400 includes an ECC memory 410, an ECC encoder 420, and an ECC decoder 430.

The ECC memory 410 stores a first ECC 415. The first ECC 415 may be represented by a generation matrix. For example, a data format/structure of the first ECC 415 may be a generation matrix. The first ECC 415 may include a plurality of column vectors corresponding to data bits in the main data (e.g., MD) and the parity data.

The ECC encoder 420 is connected to the ECC memory 410, and may perform ECC encoding on the main data MD using the first ECC 415 stored in the ECC memory 410 to generate the parity data PRT in a write operation of the semiconductor memory device 200. The ECC encoder 420 may provide the I/O gating circuit 290 with the codeword CW including the main data MD and the parity data PRT.

The ECC decoder 430 is connected to the ECC memory 410, may receive the codeword CW including the main data MD and the parity data PRT, may perform ECC decoding on the main data MD based on the parity data PRT using the first ECC 415 to correct and/or detect an error bit in the main data MD, and may output corrected main data C_MD.

Although it is described with reference to FIG. 11 that the ECC memory 410 is coupled to the ECC encoder 420 and the ECC decoder 430, in example embodiments, the ECC memory 410 may be implemented with exclusive OR gates within the ECC encoder 420 and the ECC decoder 430.

FIGS. 12A, 12B, 12C and 12D illustrate examples of error bit in data pattern stored in a sub array block according to a least significant bit (LSB) of the row address, respectively.

Figure 12A:
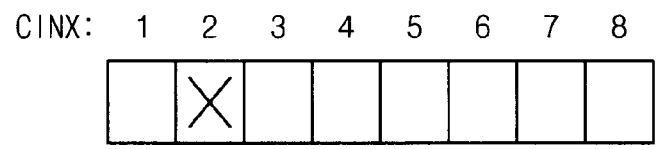
FIGS. 12A, 12B, 12C and 12D illustrate examples of error bit in data pattern stored in a sub array block according to a least significant bit of the row address, respectively.
Figure 12B:
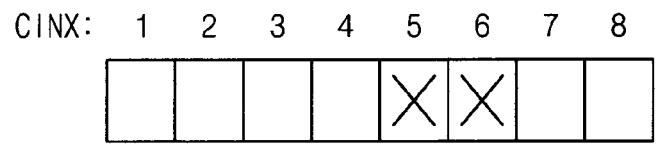
Figure 12C:
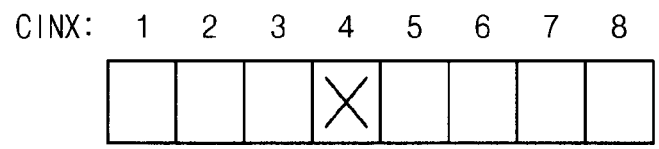
Figure 12D:
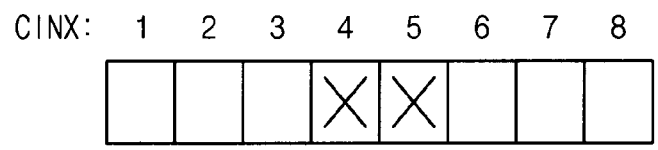

FIGS. 12A and 12C illustrate that a single bit error occurs in a data pattern, respectively. FIGS. 12B and 12D illustrate that two bit errors occur in adjacent two memory cells, respectively.

In FIGS. 12A, 12B, 12C and 12D, X denotes an error bit.

Referring to FIG. 12A, the LSB of the row address is a low level such that the row address designates a target page coupled to an even word-line, and a memory cell designated by a CINX 2 (cell index) includes a single bit error. Referring to FIG. 12B, the LSB of the row address is a low level, and each of two memory cells designated by CINX 5 and CINX 6 includes an error bit. That is, two bit errors occur in the adjacent two memory cells designated by CINX 5 and CINX 6. In FIG. 12B, two bit errors do not occur or only a low probability exists that two bit errors occur in the adjacent two memory cells designated by, for example, CINX 2 and CINX 3, CINX 4 and CINX 5 and CINX 6 and CINX 7.

Referring to FIG. 12C, the LSB of the row address is a high level such that the row address designates a target page coupled to an odd word-line, and a memory cell designated by CINX 4 includes a single bit error. Referring to FIG. 12D, the LSB of the row address is a high level, and each of memory cells designated by CINX 4 and CINX 5 includes an error bit. That is, two bit errors occur in the adjacent two memory cells designated by CINX 4 and CINX 5. In FIG. 12D, two bit errors do not occur or only a low probability exists that two bit errors occur in the adjacent two memory cells designated by, for example, CINX 1 and CINX 2, CINX 3 and CINX 4, CINX 5 and CINX 6, and CINX 7 and CINX 8.

Two bit errors do not occur or only a low probability exists that two bit errors occur in most pairs of adjacent two memory cells as illustrated in FIGS. 12B and 12D. The strictures of memory cells in the target page may be different based on the LSB of the row address, and this may result in occurrence or non-occurrence of two bit errors occurring in two adjacent memory cells.

Figure 13:
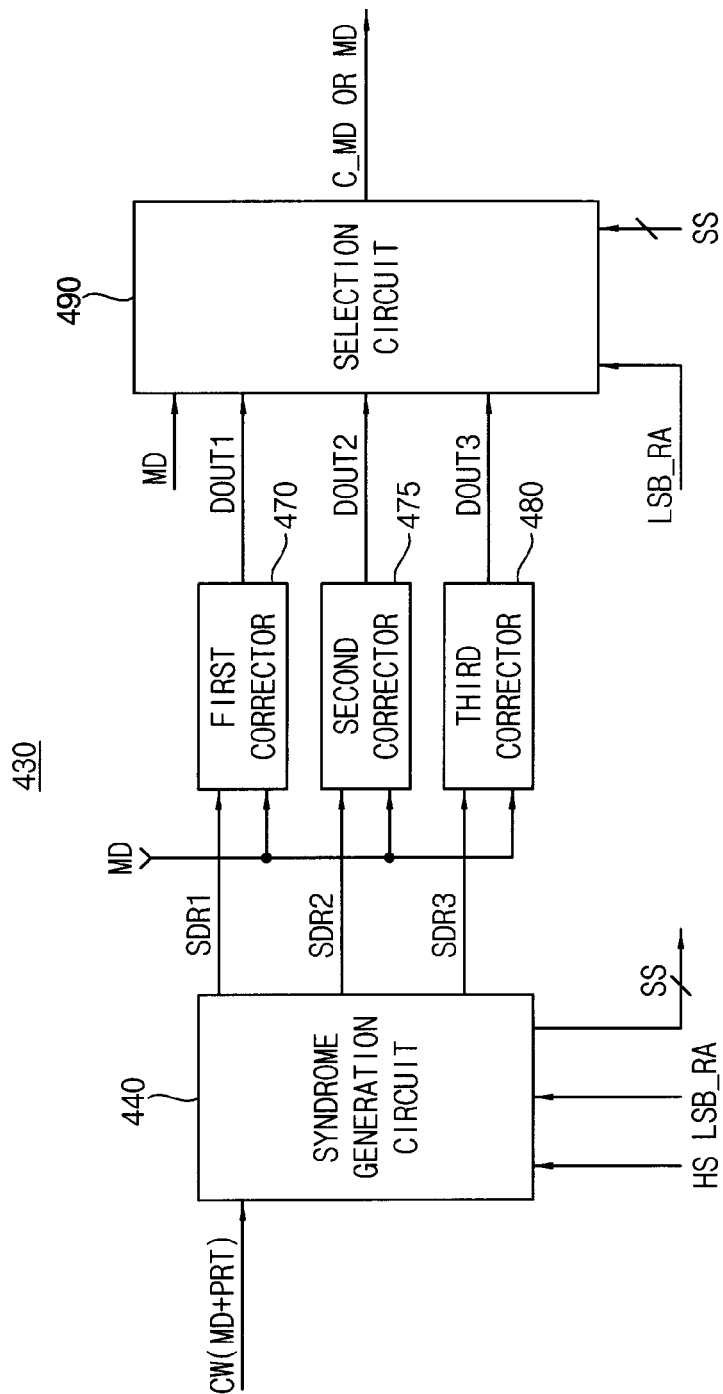
FIG. 13 is a block diagram illustrating the ECC decoder in the error correction circuit of FIG. 11 according to some example embodiments.

FIG. 13 is a block diagram illustrating the ECC decoder in the error correction circuit of FIG. 11 according to some example embodiments.

Referring to FIG. 13, the ECC decoder 430 includes a syndrome generation circuit 440, a first corrector 470, a second corrector 475, a third corrector 480 and a selection circuit 490.

The syndrome generation circuit 440 generates a first syndrome SDR1, a second syndrome SDR2 and a third syndrome SDR3 based on a parity check matrix HS and the read codeword CW. The syndrome generation circuit 440 generates a selection signal SS based on the LSB LSB_RA of the row address and one of the first syndrome SDR1, the second syndrome SDR2 and the third syndrome SDR3.

The first corrector 470 corrects a single bit error in the main data MD based on the first syndrome SDR1 to provide a first output data DOUT1. The second corrector 475 corrects two bit errors in the main data MD based on the second syndrome SDR2 to provide a second output data DOUT2, in response to the LSB LSB_RA of the row address being a low level. The third corrector 480 corrects two bit errors in the main data MD based on the third syndrome SDR3 to provide a third output data DOUT3, in response to the LSB LSB_RA of the row address being a high level.

The selection circuit 490 receives the main data MD, the first output data DOUT1, the second output data DOUT2 and the third output data DOUT3, and selects one of the main data MD, the first output data DOUT1, the second output data DOUT2 and the third output data DOUT3 based on the selection signal SS and the LSB LSB_RA of the row address to output the corrected main data C_MD and the main data MD.

Figure 14:
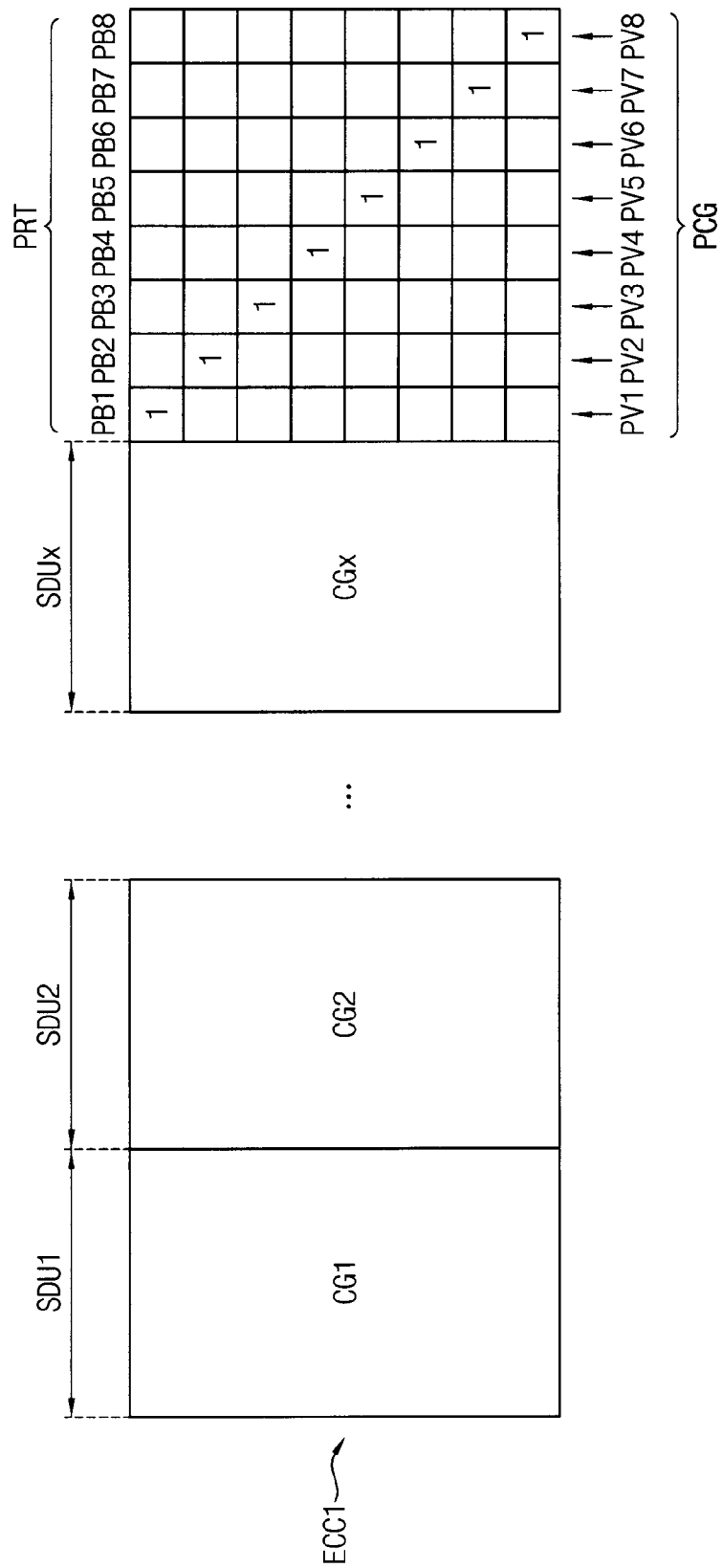
FIG. 14 illustrates relationships of the first ECC and the parity bits used in the error correction circuit of FIG. 11 according to some example embodiments.

FIG. 14 illustrates relationships of the first ECC and the parity bits used in the error correction circuit of FIG. 11 according to some example embodiments.

In FIG. 14, it is assumed that the main data MD includes a plurality of sub data units SDU1~SDUx, and the parity data PRT includes 8-bit parity bits PB1~PB8. In FIG. 14, it is assumed that x is a natural number equal to or greater than eight.

Referring to FIG. 14, the first ECC 415 may be divided into a plurality of code groups CG1~CGx and PCG corresponding to the plurality of sub data units SDU1~SDUx and the parity data PRT. The code group PCG may include a plurality of column vectors PV1~PV8 corresponding to parity bits PB1~PB8 of the parity data PRT.

Figure 15:
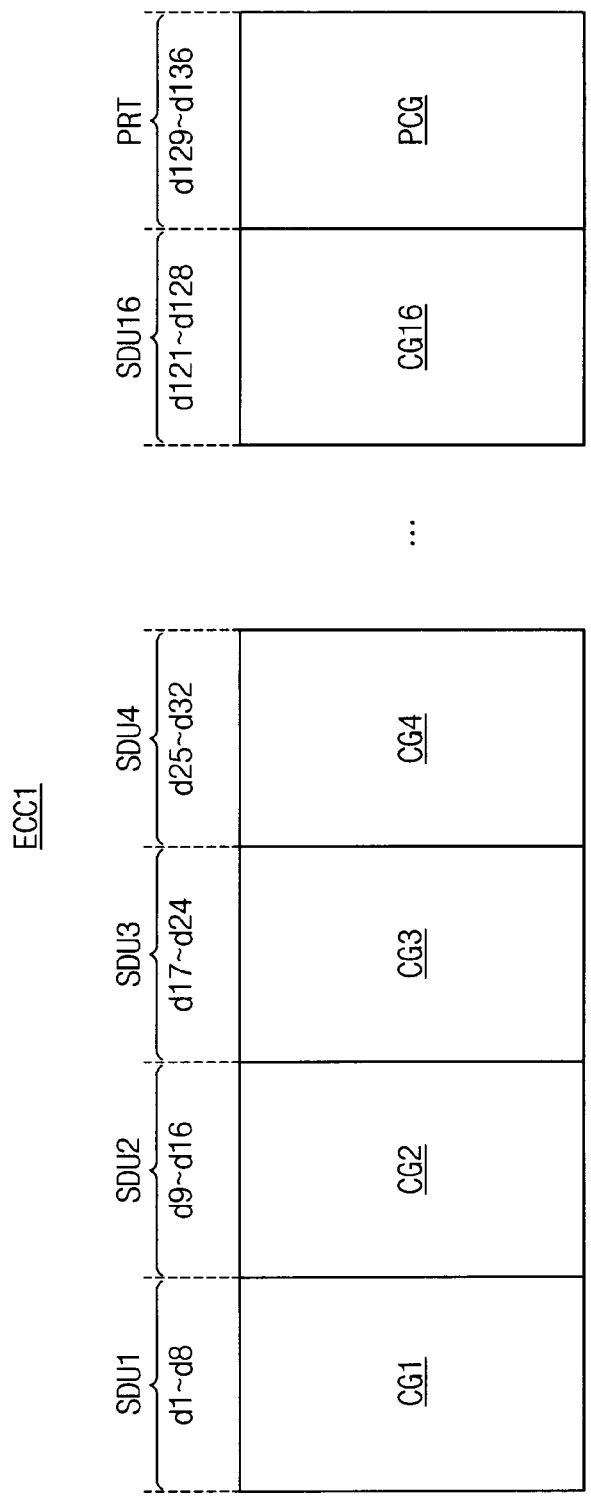
FIG. 15 illustrates an example of the first ECC in FIG. 14 according to some example embodiments.
Figure 16A:
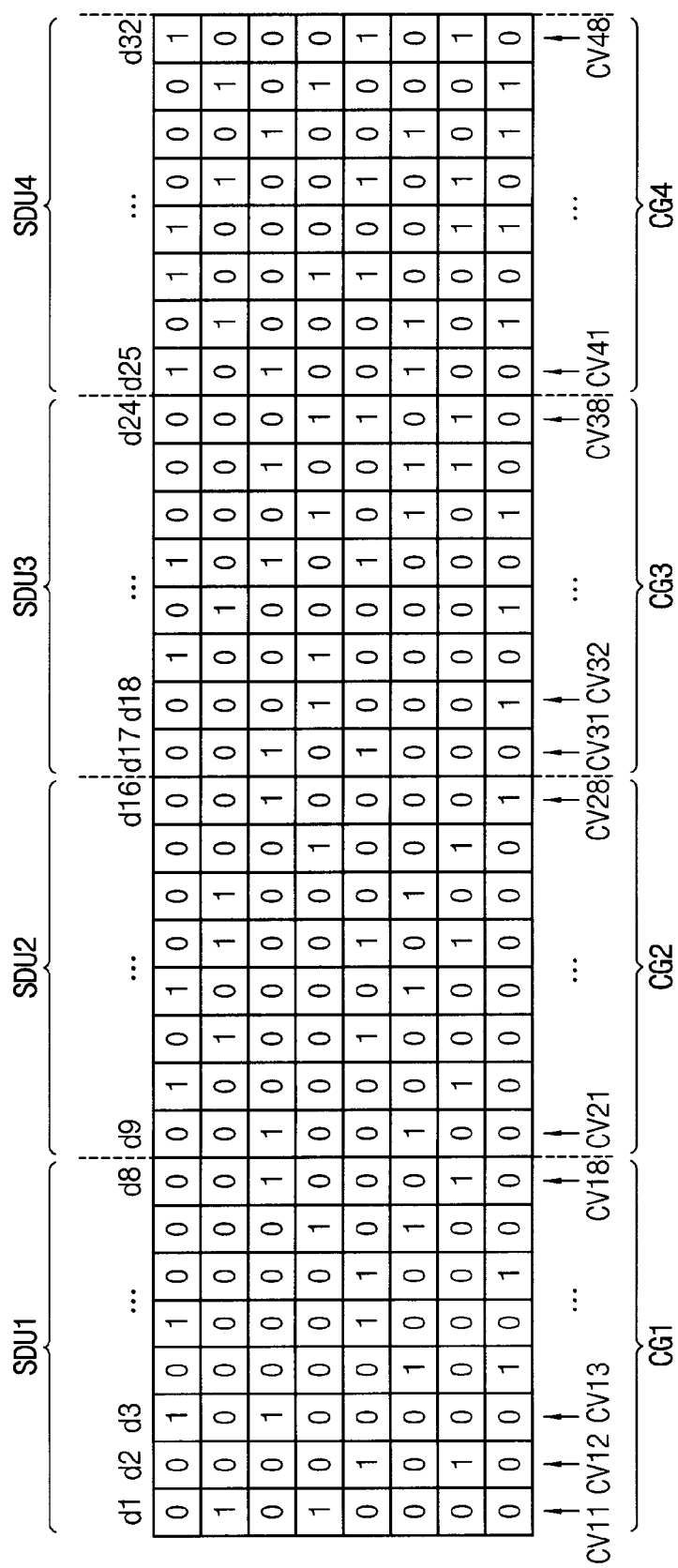
Figure 16B:
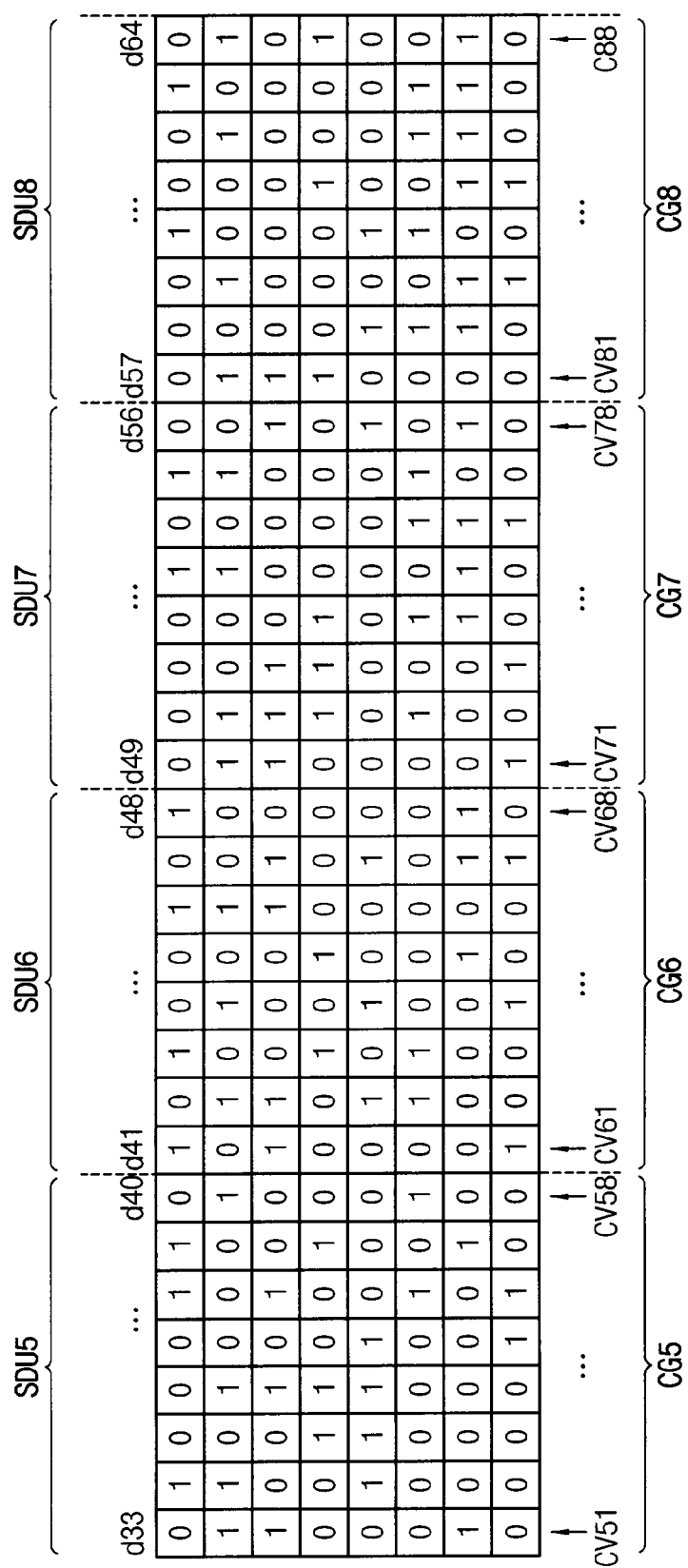
Figure 16C:
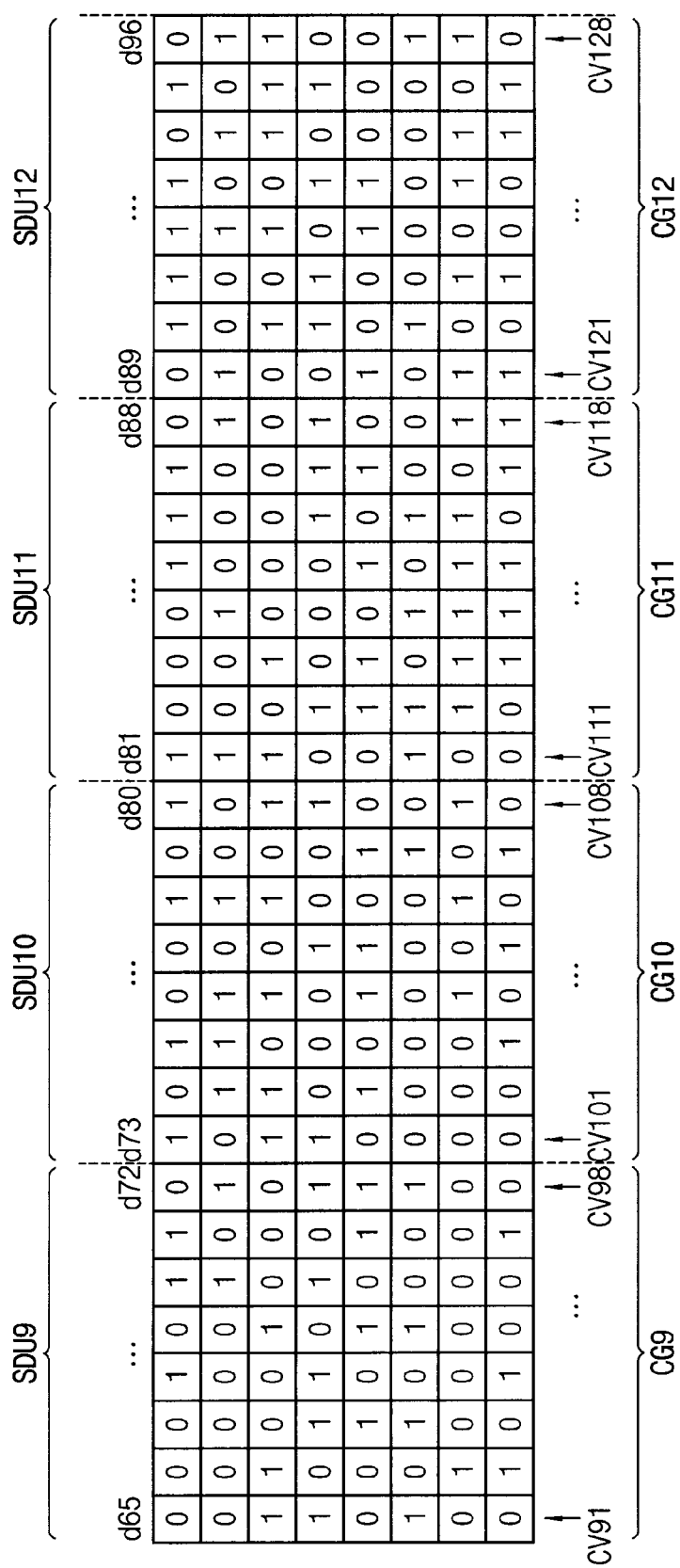

FIG. 15 illustrates an example of the first ECC in FIG. 14 according to some example embodiments.

In FIG. 15, it is assumed that the main data MD includes 128-bit data bits d1~d128 and the parity bits PB1~PB8 corresponds to data bits d129~d136. That is, it is assumed that x is eight in FIG. 14.

Referring to FIG. 15, the data bits d1~d128 of the main data MD may be divided into first through sixteenth sub data units SDU1~SDU16. Each of the first through sixteenth sub data units SDU1~SDU16 includes 8-bit data bits.

A first ECC 415, i.e., the parity check matrix HS mentioned above with respect to FIG. 13, includes first through sixteenth code groups CG1~CG16 corresponding to the first through sixteenth sub data units SDU1~SDU16 and the code group PCG corresponding to the parity bits PB1~PB8.

FIGS. 16A, 16B, 16C, 16D and 16E illustrate an example of the parity check matrix of FIG. 15.

Referring to FIGS. 16A, 16B, 16C, 16D and 16E, the parity check matrix HS includes first through sixteenth code groups CG1~CG16 corresponding to the first through sixteenth sub data units SDU1~SDU16 and a code group PCG corresponding to the parity bits PB1~PB8.

The first through sixteenth code groups CG1~CG16 include column vectors CV11~CV18, CV21~CV28, CV31~CV38, CV41~CV48, CV51~CV58, CV61~CV68, CV71~CV78, CV81~CV88, CV91~CV98, CV101~CV108, CV111~CV118, CV121~CV128, CV131~CV138, CV141~CV148, CV151~CV158 and CV161~CV168 and the code group PCG includes column vectors PV1~PV8.

The column vectors CV11~CV18 correspond to the data bits d1~d8. The column vectors CV21~CV28 correspond to the data bits d9~d16. The column vectors CV31~CV38 correspond to the data bits d17~d24. The column vectors CV41~CV48 correspond to the data bits d25~d32. The column vectors PV1~PV8 correspond to the data bits d129~d136.

The syndrome generation circuit 440 in FIG. 13 may generate a first sub check matrix (HS1 in FIG. 19A) and a second sub check matrix (HS2 in FIG. 19A) by using the column vectors CV11~CV168 and PV1~PV8 of the parity check matrix HS.

Figure 17A:
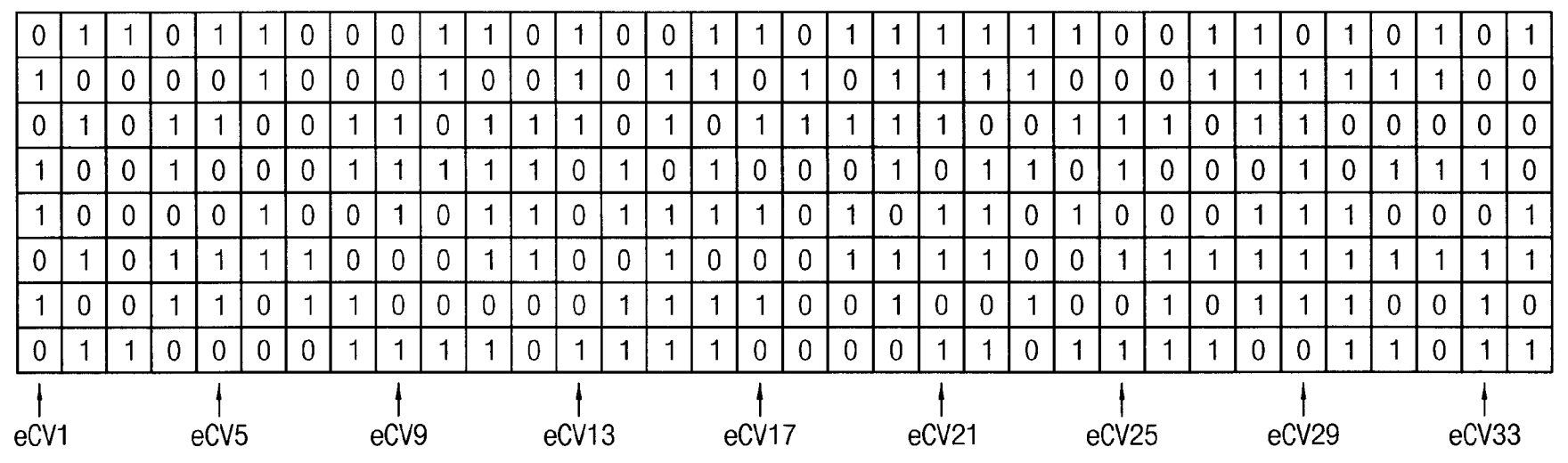
Figure 17B:
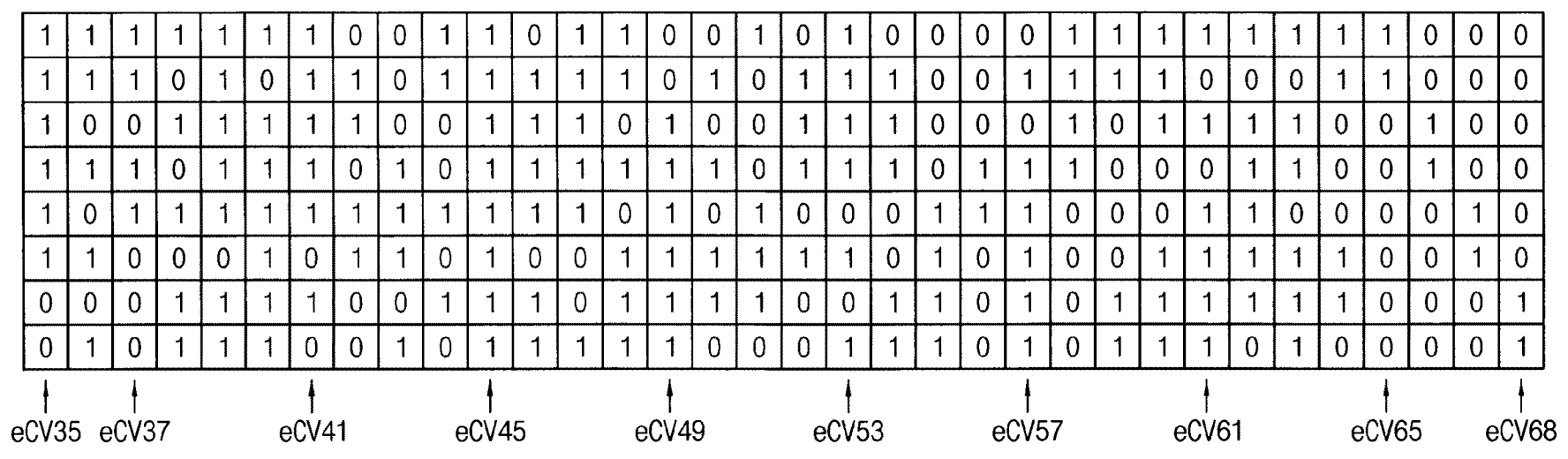

FIGS. 17A and 17B illustrate an example of the first sub check matrix which is generated by using the parity check matrix.

The syndrome generation circuit 440 in the ECC decoder 430 may generate the first sub check matrix (HS1 in FIG. 19A) by using the column vectors CV11~CV168 and PV1~PV8 of the parity check matrix HS, which is to be applied, when the target page is coupled to an even word-line.

Referring to FIGS. 17A and 17B, the syndrome generation circuit 440 may generate the first sub check matrix HS1 by performing an exclusive OR operation on adjacent a $(2i-1)$-th column vector and a $(2i)$-th column vector among the column vectors CV11~CV168 and PV1~PV8 in FIGS. 16A, 16B, 16C, 16D and 16E. Here, i is one of 1 to k, k being a number of data bits in each of the sub data units SDU1~SDU16. The first sub check matrix HS1 may include even column vectors eCV1~eCV68.

For example, the syndrome generation circuit 440 may generate the even column vector eCV1 by performing an exclusive OR operation on the column vectors CV11 and CV12 and may generate the even column vector eCV2 by performing an exclusive OR operation on the column vectors CV13 and CV14.

Figure 18A:
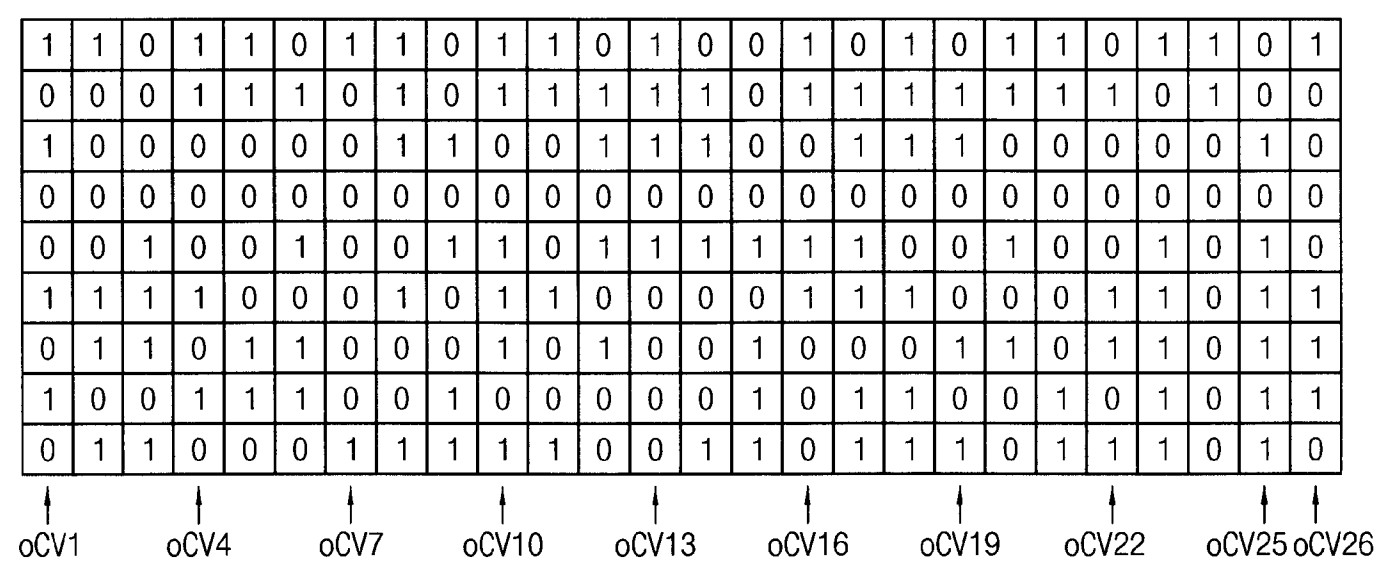
Figure 18B:
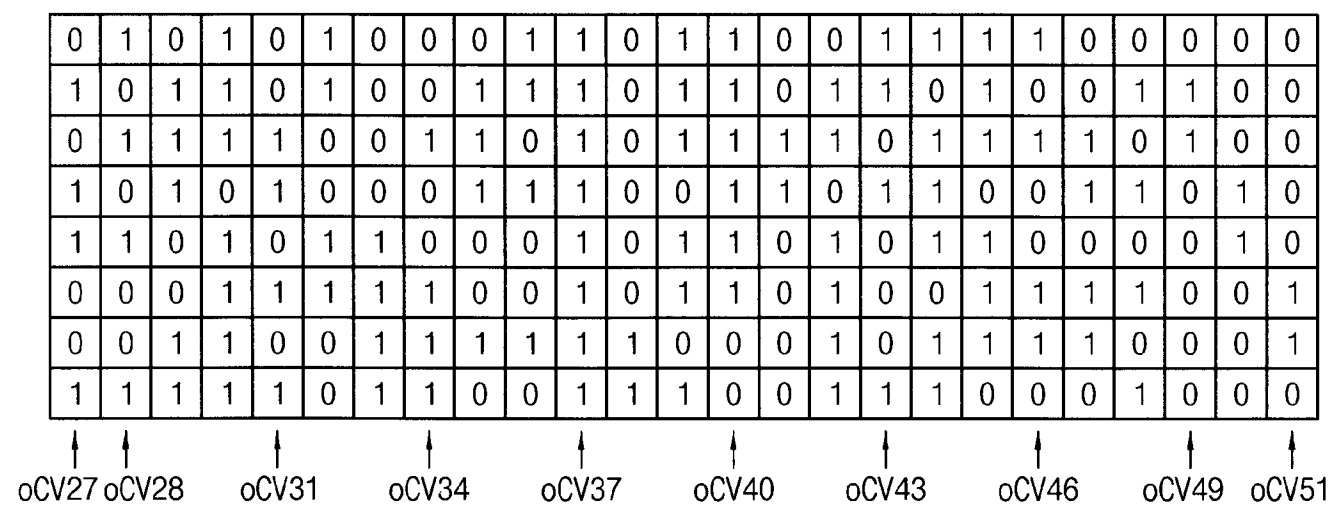

FIGS. 18A and 18B illustrate an example of the second sub check matrix which is generated by using the parity check matrix.

The syndrome generation circuit 440 in the ECC decoder 430 may generate the second sub check matrix (HS2 in FIG. 19A) by using the column vectors CV11~CV168 and PV1~PV8 of the parity check matrix HS, which is to be applied, when the target page is coupled to an odd word-line.

Referring to FIGS. 18A and 18B, the syndrome generation circuit 440 may generate the second sub check matrix HS2 by performing an exclusive OR operation on adjacent a $(2i)$-th column vector and a $(2i+1)$-th column vector among the column vectors CV11~CV168 and PV1~PV8 in FIGS. 16A, 16B, 16C, 16D and 16E. The second sub check matrix HS2 may include odd column vectors oCV1~oCV51.

For example, the syndrome generation circuit 440 may generate the odd column vector oCV1 by performing an exclusive OR operation on the column vectors CV12 and CV13 and may generate the odd column vector oCV2 by performing an exclusive OR operation on the column vectors CV14 and CV15.

Figure 19A:
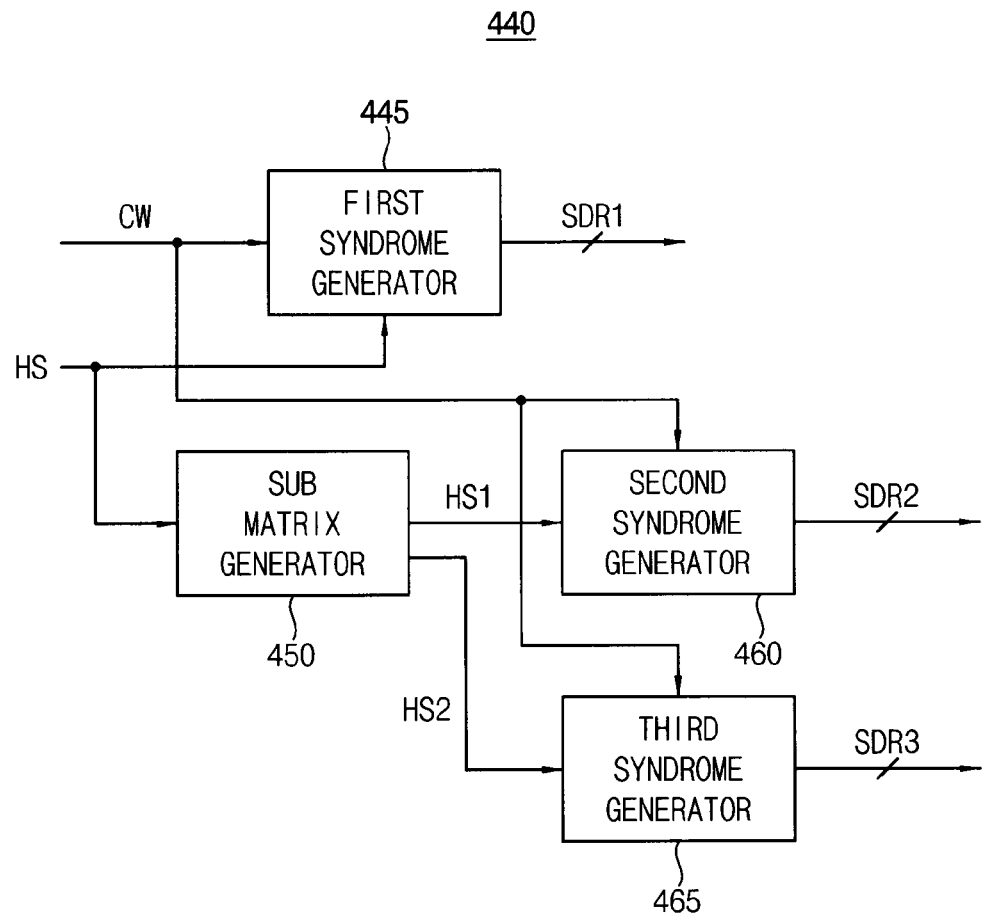
FIG. 19A is a block diagram illustrating the syndrome generation circuit in the ECC decoder of FIG. 13 according to some example embodiments.
Figure 19A:
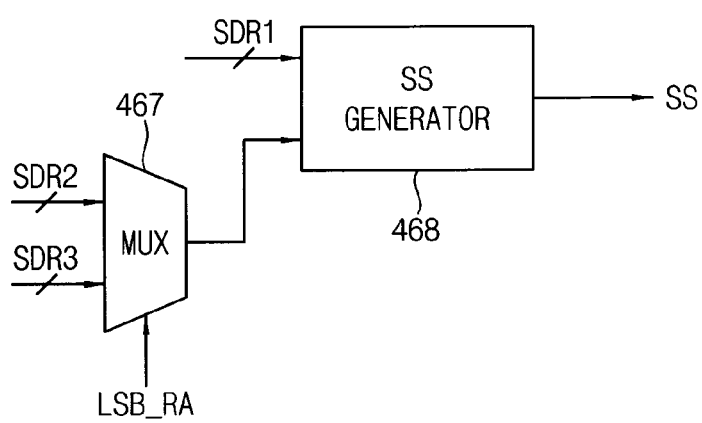

FIG. 19A is a block diagram illustrating the syndrome generation circuit in the ECC decoder of FIG. 13 according to some example embodiments.

Referring to FIG. 19A, the syndrome generation circuit 440 may include a first syndrome generator 445, a sub check matrix generator 450, a second syndrome generator 460, a third syndrome generator 465, a multiplexer 467 (MUX) and a selection signal generator 468 (SS generator).

The first syndrome generator 445 may generate the first syndrome SDR1 by applying the parity check matrix HS to the read codeword CW. The sub check matrix generator 450 may generate the first sub check matrix HS1 based on a first portion of the parity check matrix HS as described with reference to FIGS. 17A and 17B and may generate the second sub check matrix HS2 based on a second portion of the parity check matrix HS as described with reference to FIGS. 18A and 18B.

The second syndrome generator 460 may generate the second syndrome SDR2 by applying the first sub check matrix HS1 to the read codeword CW. The third syndrome generator 465 may generate the third syndrome SDR3 by applying the second sub check matrix HS2 to the read codeword CW. The third syndrome generator 465 may apply the second sub check matrix HS2 to the read codeword in response to the LSB of the row address being an even number. That is, the third syndrome generator 465 may apply the second sub check matrix HS2 to the read codeword based on the LSB of the row address being a low level such that the row address designates a target page coupled to an even word-line.

The multiplexer 467 may receive the second syndrome SDR2 and the third syndrome SDR3 and may select one of the second syndrome SDR2 and the third syndrome SDR3 based on the LSB LSB_RA of the row address. The selection signal generator 468 may receive the first syndrome SDR1 and an output of the multiplexer 467 and may generate the selection signal SS based on logic levels of the first syndrome SDR1 and one of the second syndrome SDR2 and the third syndrome SDR3.

If the first ECC 415 corresponds to a single error correction (SEC) code, the first syndrome SDR1 and the second syndrome SDR2 cannot have non-zero value simultaneously and the first syndrome SDR1 and the third syndrome SDR3 cannot have non-zero value simultaneously. Therefore, when the read codeword CW includes a single bit error, one of the second syndrome SDR2 and the third syndrome SDR3 has non-zero value.

In addition, when the read codeword CW does not include error(s), the first syndrome SDR1 and the second syndrome SDR2 have non-zero value simultaneously or the first syndrome SDR1 and the third syndrome SDR3 have non-zero value simultaneously. Therefore, the selection signal generator 468 may determine a logic level of the selection signal SS based on the values of the first syndrome SDR1, the second syndrome SDR2 and the third syndrome, in accordance with the description above.

Figure 19B:
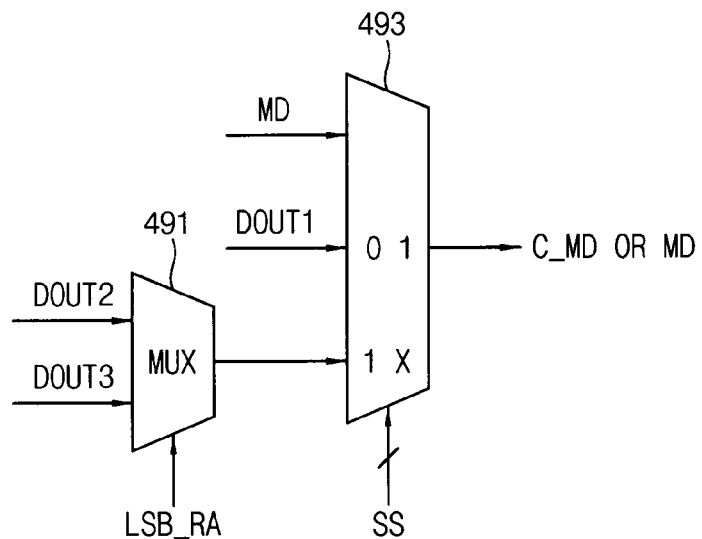
FIG. 19B is a block diagram illustrating the selection circuit in the ECC decoder of FIG. 13 according to some example embodiments.

FIG. 19B is a block diagram illustrating the selection circuit in the ECC decoder of FIG. 13 according to some example embodiments.

Referring to FIG. 19B, the selection circuit 490 may include a first multiplexer 491 and a second multiplexer 493.

The first multiplexer 491 receives the second output data DOUT2 and the third output data DOUT3 and selects one of the second output data DOUT2 and the third output data DOUT3 in response to the LSB LSB_RA of the row address.

When the target page is coupled to an even word-line, the first multiplexer 491 provides the second output data DOUT2. When the target page is coupled to an odd word-line, the first multiplexer 491 provides the third output data DOUT3. The second multiplexer 493 receives the main data MD, the first output data DOUT1 and an output of the first multiplexer 491, selects one of the main data MD, the first output data DOUT1 and the output of the first multiplexer 491 in response to the selection signal SS and outputs the selected one as the main data MD or the corrected main data C_MD.

Figure 20:
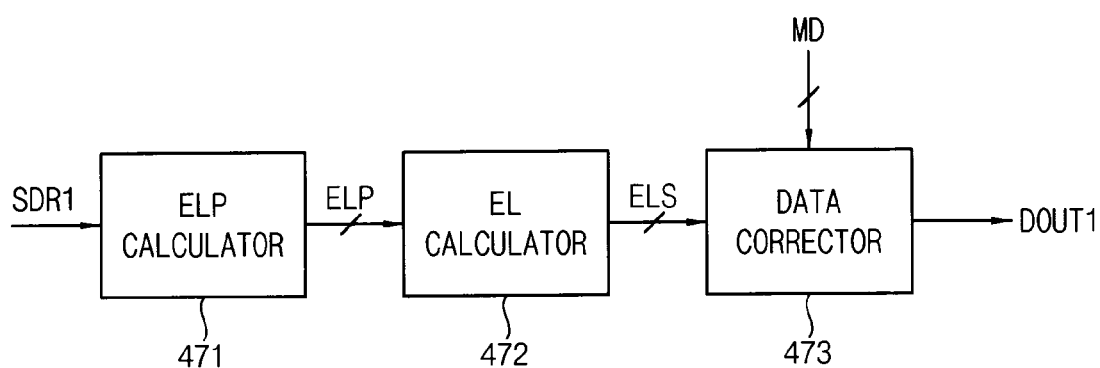
FIG. 20 is a block diagram illustrating the first corrector in the ECC decoder of FIG. 13 according to some example embodiments.

FIG. 20 is a block diagram illustrating the first corrector in the ECC decoder of FIG. 13 according to some example embodiments.

Referring to FIG. 20, the first corrector 470 may include an error locator polynomial calculator 471 (ELP calculator), an error locator calculator 472 (EL calculator) and a data corrector 473.

The error locator polynomial calculator 471 may calculate coefficients ELP of an error locator polynomial based on the first syndrome SDR1 and provide the coefficients ELP of the error locator polynomial to the error locator calculator 472. The error locator calculator 472 may calculate error locations based on the coefficients ELP of the error locator polynomial and provide the data corrector 473 with an error location signal ELS indicating location(s) of the error(s). The data corrector 473 may correct the single bit error in the main data MD based on the error location signal ELS and provide the first output data DOUT1.

Figure 21:
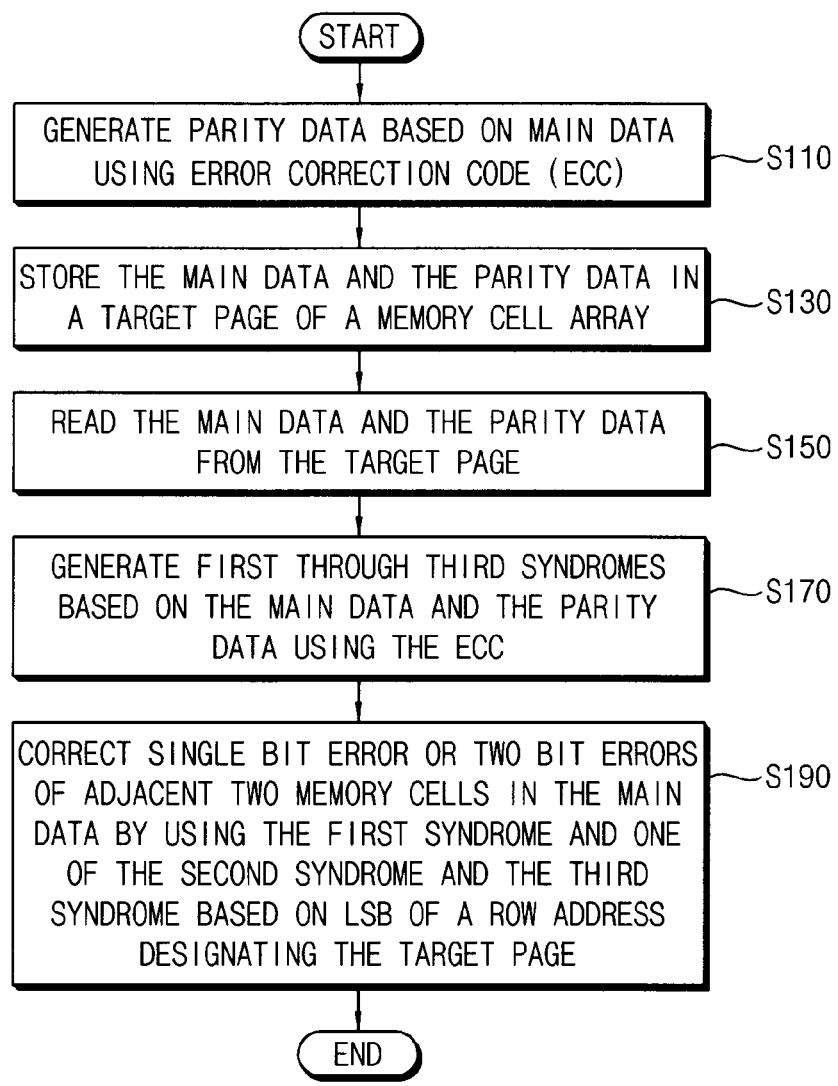
FIG. 21 is a flow chart illustrating a method of operating a semiconductor memory device according to some example embodiments.

FIG. 21 is a flow chart illustrating a method of operating a semiconductor memory device according to some example embodiments.

Referring to FIGS. 5 through 21, in a method of operating a semiconductor memory device 200 including a memory cell array 300, an error correction circuit 400 generates a parity data PRT based on the main data MD, by using a first ECC 415 (S110).

The first ECC 415 may be represented by a generation matrix, may include a plurality of column vectors, and the column vectors may be divided into a plurality of code groups corresponding to sub data units of the main data MD and the parity data PRT.

The error correction circuit 400 stores the main data MD and the parity data PRT in a target page of the memory cell array 300 via an I/O gating circuit 290 (S130).

The error correction circuit 400 reads the main data MD and the parity data PRT from the target page of the memory cell array 300 via the I/O gating circuit 290 (S150).

The error correction circuit 400 generates a first syndrome SDR1, a second syndrome SDR2 and a third syndrome SDR3 based on the main data MD, by using the first ECC 415 (S170).

The error correction circuit 400 corrects a single bit error in the main data MD or two bit errors in the main data MD, which occur in adjacent two memory cells by using the first syndrome SDR1 and one of the second syndrome SDR2 and the third syndrome SDR3, which is selected based on a LSB of the row address designating the target page (S190).

Therefore, the error correction circuit and the semiconductor memory device including the error correction circuit may correct the single bit error and the two bit errors by applying different syndromes to the single bit error and the two bit errors by using the parity check matrix which is based on the ECC, and thus may increase efficiency of error correcting.

Figure 22:
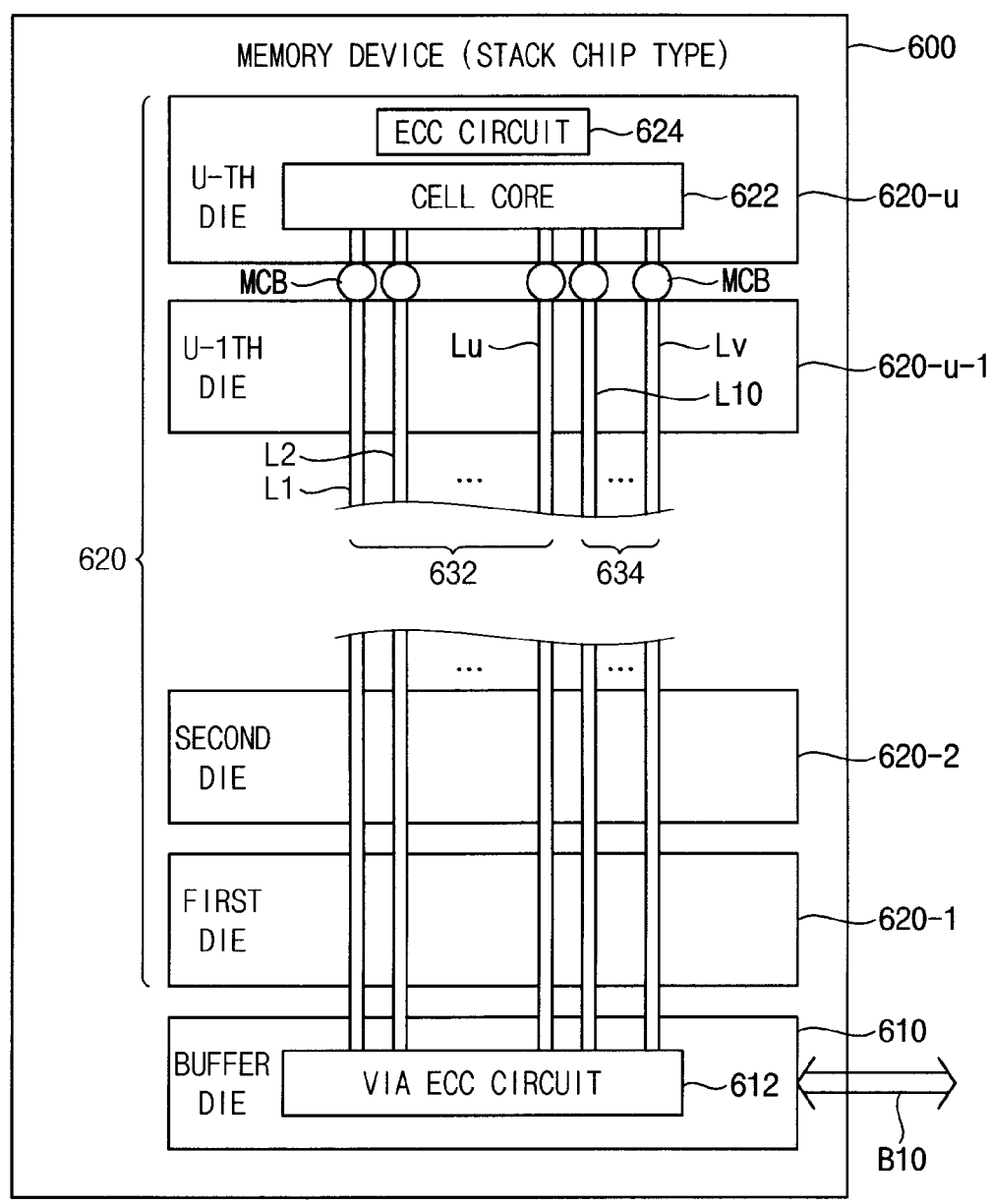
FIG. 22 is a block diagram illustrating a semiconductor memory device according to some example embodiments.

FIG. 22 is a block diagram illustrating a semiconductor memory device according to some example embodiments.

Referring to FIG. 22, a semiconductor memory device 600 may include one or more of the buffer die 610 and group dies 620 providing a soft error analyzing and correcting function in a stacked chip structure.

The group dies 620 may be a high-bandwidth memory (HBM).

The group dies 620 may include a plurality of memory dies 620-1 to 620-$u$ (u is a natural number greater than two) which is stacked on one or more of the buffer die 610 and convey data through a plurality of through a plurality of silicon via (TSV) lines.

Each of the memory dies 620-1 to 620$u$ may include a cell core 622 and an ECC circuit 624 and the cell core 622 may include a memory cell array including a plurality of sub array blocks arranged in a first direction and a second direction. The ECC circuit 624 may be referred to as an error correction circuit and may employ the error correction circuit 400 of FIG. 11. Therefore, the ECC circuit 624 may correct a single bit error and two bit errors by applying different syndromes to the single bit error and the two bit errors by using one parity check matrix which is based on an ECC, and thus may increase efficiency of error correcting The buffer die 610 may include an via ECC circuit 612 which corrects a transmission error using the transmission parity bits when a transmission error is detected from the transmission data received through the TSV lines and generate error-corrected data. The via ECC circuit 612 may be referred to as a via error correction circuit.

The semiconductor memory device 600 may be a stack chip type memory device or a stacked memory device which conveys data and control signals through the TSV lines. The TSV lines may also be called through electrodes.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 632 which is formed at one memory die 620-u may include 128 TSV lines L1 to Lu, and a parity TSV line group 634 may include TSV lines L10 to Lv.

The TSV lines L1 to Lu of the data TSV line group 632 and the parity TSV lines L10 to Lv of the parity TSV line group 634 may be connected to micro bumps MCB which are correspondingly formed among the memory dies 620-1 to 620-u.

Each of the memory dies 620-1 to 620-u may include DRAM cells each including at least one access transistor and one storage capacitor.

The semiconductor memory device 600 may have a three-dimensional (3D) chip structure or a 2.5D chip structure to communicate with a memory controller through a data bus B10. The buffer die 610 may be connected with the memory controller through the data bus B10.

The via ECC circuit 612 may determine whether a transmission error occurs at the transmission data received through the data TSV line group 632, based on the transmission parity bits received through the parity TSV line group 634.

When a transmission error is detected, the via ECC circuit 612 may correct the transmission error on the transmission data using the transmission parity bits. When the transmission error is uncorrectable, the via ECC circuit 612 may output information indicating occurrence of an uncorrectable data error.

In the context of FIG. 22 and embodiments described above, the buffer die 610 and group dies 620 may be provided in the data I/O buffer 295 shown in FIG. 5. The error correction circuit 400 may be configured to generate transmission parity data based on transmission data to be transmitted to the buffer die 610. As noted, the buffer die 610 may include a via ECC circuit 612 which corrects a transmission error using the transmission parity bits when a transmission error is detected from the transmission data received through the TSV lines and generate error-corrected data.

Figure 23:
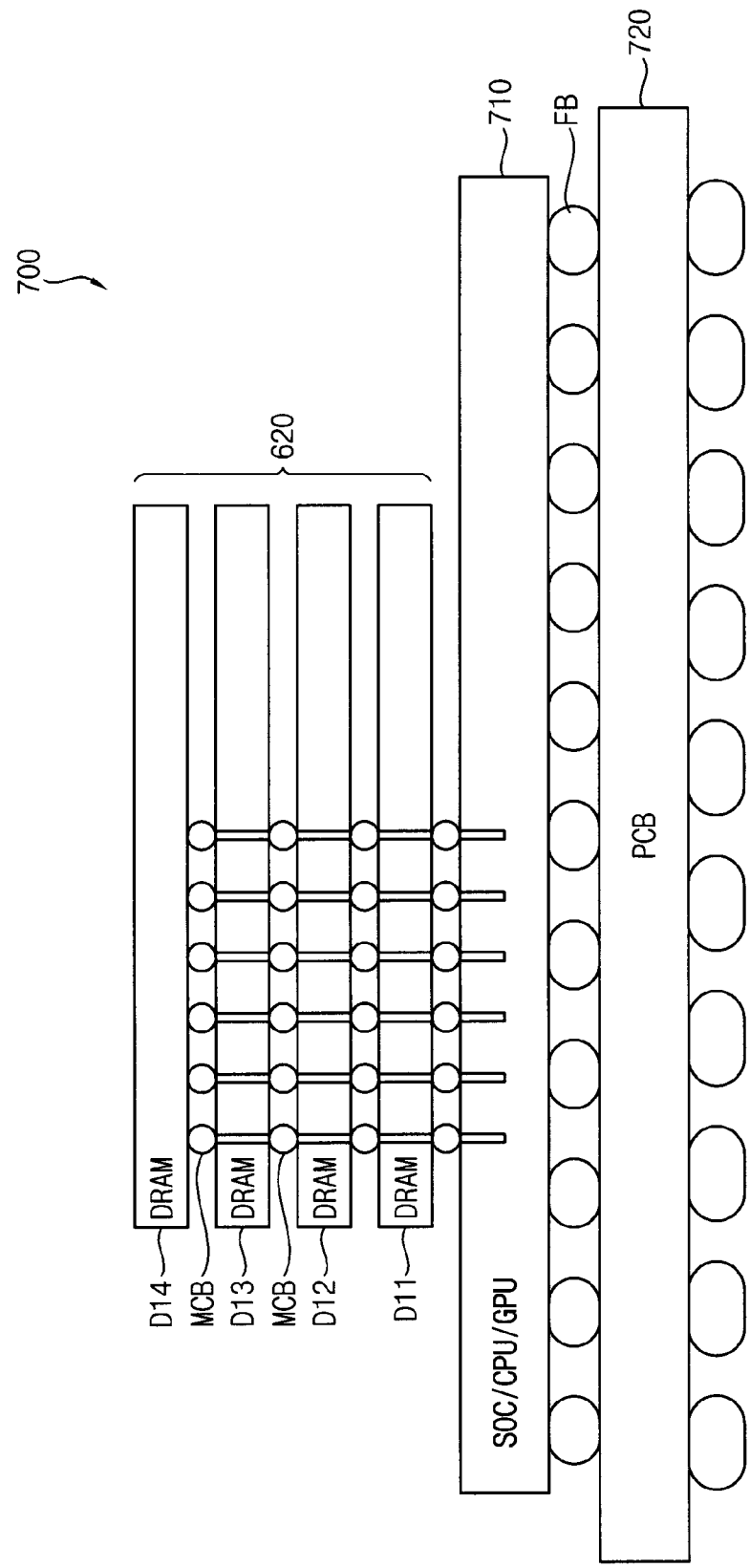
FIG. 23 is a cross-sectional view of a 3D chip structure employing the semiconductor memory device of FIG. 22 according to some example embodiments.

FIG. 23 is a cross-sectional view of a 3D chip structure employing the semiconductor memory device of FIG. 22 according to some example embodiments.

FIG. 23 shows a 3D chip structure 700 in which a host and a HBM are directly connected without an interposer layer.

Referring to FIG. 23, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure as the memory dies of the group dies 620 in FIG. 22. In FIG. 23, the buffer die 610 or a logic die of FIG. 22 is omitted. However, the buffer die 610 or the logic die may be disposed between the memory die D11 and the host die 710.

To implement the HBM structure as the memory dies of the group dies 620, TSV lines may be formed at the memory dies D11 and D14. The TSV lines may be electrically connected with micro bumps MCB placed between memory dies. In addition, each of the memory dies D11 to D14 may include an error correction circuit such as the error correction circuit 400 of FIG. 11.

Figure 24:
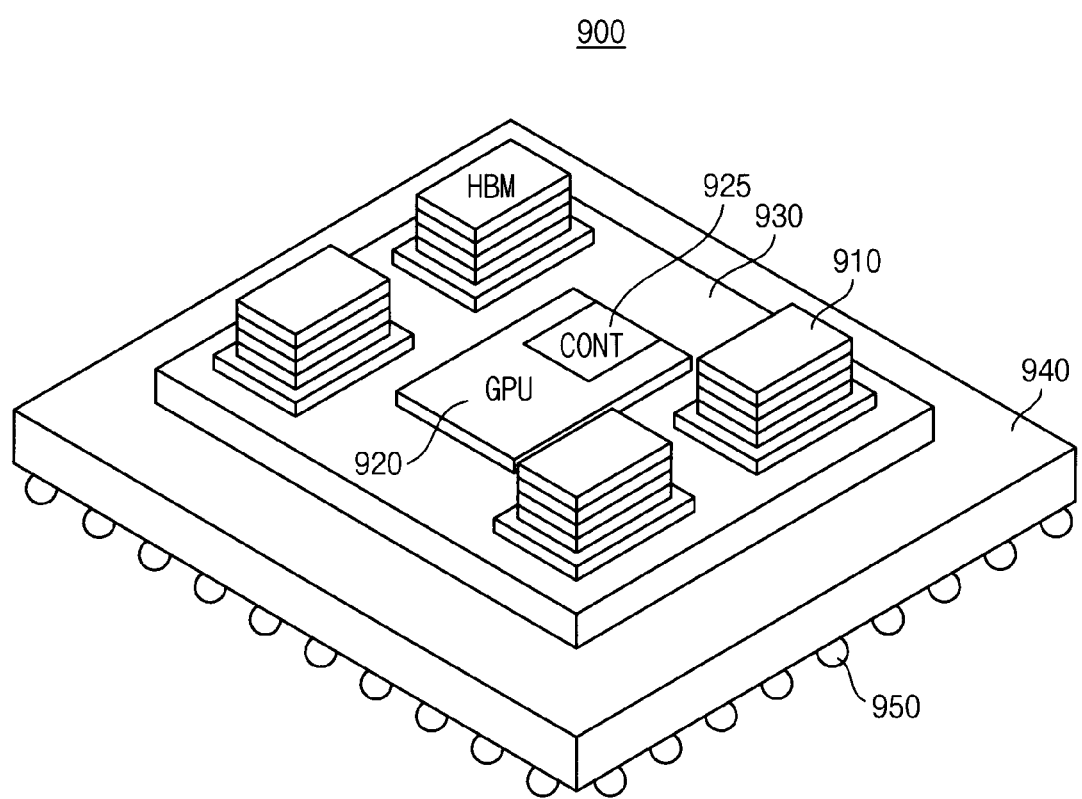
FIG. 24 is a diagram illustrating a semiconductor package including the stacked memory device according to some example embodiments.

FIG. 24 is a diagram illustrating a semiconductor package including the stacked memory device according to some example embodiments.

Referring to FIG. 24, a semiconductor package 900 may include one or more stacked memory devices 910 and a GPU 920 (graphic processing unit) and the GPU 920 includes a memory controller 925.

The stacked memory devices 910 and the GPU 920 may be mounted on an interposer 930, and the interposer on which the stacked memory devices 910 and the GPU 920 are mounted may be mounted on a package substrate 940. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, and each of the plurality of memory dies may include a memory cell array and an error correction circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the error correction circuit and the semiconductor memory device including the error correction circuit may correct the single bit error and the two bit errors by applying different syndromes to the single bit error and the two bit errors by using the parity check matrix which is based on the ECC, and thus may increase efficiency of error correcting.

Example embodiments of the present disclosure may be applied to semiconductor memory devices and memory systems employing the ECC described herein.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. An error correction circuit of a semiconductor memory device, comprising:
    an error correction code (ECC) encoder configured to generate, based on a main data, a parity data using an ECC represented by a generation matrix and configured to store a codeword including the main data and the parity data in a target page of a memory cell array; and
    an ECC decoder configured to read the codeword from the target page as a read codeword based on an address provided from outside the semiconductor memory device to generate different syndromes based on the read codeword and a parity check matrix which is based on the ECC; and apply the different syndromes to the main data in the read codeword to correct a single bit error when the single bit error exists in the main data or to correct two bit errors when the two bit errors occur in adjacent two memory cells in the target page.

2. The error correction circuit of claim 1, wherein
the ECC decoder is, in response to a least significant bit (LSB) of a row address of the address being a low level,
configured to generate a first syndrome by applying the parity check matrix to the read codeword and configured to generate a second syndrome by applying a first sub check matrix to the read codeword, the first sub check matrix being generated based on the parity check matrix.

3. The error correction circuit of claim 2, wherein the ECC decoder is configured to:
correct the single bit error in the main data based on the first syndrome; and
correct the two bit errors in the main data based on the second syndrome.

4. The error correction circuit of claim 1, wherein
the ECC decoder is, in response to a least significant bit (LSB) of a row address of the address being a high level,
configured to generate a first syndrome by applying the parity check matrix to the read codeword,
configured to generate a third syndrome by applying a second sub check matrix to the read codeword, the second sub check matrix being generated based on the parity check matrix, and
configured to apply the second sub check matrix to the read codeword in response to the LSB of the row address being an even number, the second sub check matrix being different from a first sub check matrix.

5. The error correction circuit of claim 4, wherein the ECC decoder is configured to:
correct the single bit error in the main data based on the first syndrome; and
correct the two bit errors in the main data based on the third syndrome.

6. The error correction circuit of claim 1, wherein:
the main data includes a plurality of data bits divided into a plurality of sub data units; and
the parity check matrix includes a plurality of column vectors divided into a plurality of code groups corresponding to the sub data units and the parity data.

7. The error correction circuit of claim 6, wherein the ECC decoder is configured to:
generate a first sub check matrix by performing an exclusive OR operation on a $(2i-1)$-th column vector and a $(2i)$-th column vector of the plurality of column vectors, i being one of 1 to k, k being a number of data bits in each of the sub data units; and
apply the first sub check matrix to the main data in the read codeword in response to a least significant bit (LSB) of a row address of the address being a low level.

8. The error correction circuit of claim 6, wherein the ECC is configured to:
generate a second sub check matrix by performing an exclusive OR operation on a $(2i)$-th column vector and a $(2i+1)$-th column vector of the plurality of column vectors, i being one of 1 to k, k being a number of data bits in each of the sub data units; and apply the second sub check matrix to the main data in the read codeword in response to a least significant bit (LSB) of a row address of the address being a high level.

9. The error correction circuit of claim 1, wherein the ECC decoder includes:
a syndrome generation circuit configured to generate a first syndrome, a second syndrome and a third syndrome based on the parity check matrix and the read codeword, and configured to generate a selection signal based on the first syndrome, a least significant bit (LSB) of a row address of the address and one of the second syndrome and the third syndrome;
a first corrector configured to correct the single bit error in the main data based on the first syndrome to provide a first output data;
a second corrector configured to correct the two bit errors in the main data based on the second syndrome in response to the LSB of a row address being a low level to provide a second output data;
a third corrector configured to correct the two bit errors in the main data based on the third syndrome in response to the LSB of the row address being a high level to provide a third output data; and
a selection circuit configured to select one of the main data, the first output data, the second output data and the third output data in response to the selection signal and the LSB of the row address to provide a corrected main data or the main data.

10. The error correction circuit of claim 9, wherein the syndrome generation circuit includes:
a first syndrome generator configured to generate the first syndrome by applying the parity check matrix to the read codeword;
a sub check matrix generator configured to generate a first sub check matrix based on a first portion of the parity check matrix and configured to generate a second sub check matrix based on a second portion of the parity check matrix;
a second syndrome generator configured to generate the second syndrome by applying the first sub check matrix to the read codeword;
a third syndrome generator configured to generate the third syndrome by applying the second sub check matrix to the read codeword;
a multiplexer configured to select one of the second syndrome and the third syndrome based on the LSB of the row address; and
a selection signal generator configured to generate the selection signal based on the first syndrome and an output of the multiplexer.

11. A semiconductor memory device, comprising:
a memory cell array including a plurality of volatile memory cells connected to word-lines and bit-lines;
an error correction circuit configured to:
generate, based on a main data, a parity data using an error correction code (ECC) represented by a generation matrix and configured to store a codeword including the main data and the parity data in a target page of the memory cell array;
read the codeword from the target page as a read codeword based on an address provided from outside the semiconductor memory device to generate different syndromes based on the read codeword and a parity check matrix which is based on the ECC, and apply the different syndromes to the main data in the read codeword to correct a single bit error when the single bit error exists in the main data or to correct two bit errors when the two bit errors occur in adjacent two memory cells in the target page; and a control logic circuit configured to control the error correction circuit based on a command and the address from outside the semiconductor memory device.

12. The semiconductor memory device of claim 11, wherein:

the error correction circuit includes an ECC decoder configured to apply the different syndromes to the single bit error and the two bit errors based on the read codeword;

the ECC decoder is, in response to a least significant bit (LSB) of a row address of the address being a low level, configured to generate a first syndrome by applying the parity check matrix to the read codeword and configured to generate a second syndrome by applying a first sub check matrix to the read codeword, the first sub check matrix being generated based on the parity check matrix; and the ECC decoder is, in response to the LSB of the row address being a high level, configured to generate a third syndrome by applying a second sub check matrix to the read codeword, the second sub check matrix being generated based on the parity check matrix, the second sub check matrix being different from the first sub check matrix.

13. The semiconductor memory device of claim 12, wherein the ECC decoder is configured to:

correct the single bit error in the main data based on the first syndrome; and correct the two bit errors in the main data by using one of the second syndrome and the third syndrome based on the LSB of the row address.

14. The semiconductor memory device of claim 11, wherein:

the memory cell array includes a plurality of sub array blocks arranged in a first direction and a second direction crossing the first direction;

the main data includes a plurality of data bits divided into a plurality of sub data units;

the semiconductor memory device further includes an input/output (I/O) gating circuit connected between the memory cell array and the error correction circuit; and the control logic circuit is configured to control the input/output (I/O) gating circuit such that the sub data units and the parity data are stored in target sub array blocks among the sub array blocks.

15. The semiconductor memory device of claim 14, wherein:

the parity check matrix includes a plurality of column vectors divided into a plurality of code groups corresponding to the sub data units and the parity data;

the error correction circuit includes an ECC decoder configured to apply the different syndromes to the single bit error and the two bit errors based on the read codeword;

the ECC decoder is configured to, generate a first sub check matrix by performing an exclusive OR operation on a (2i−1)-th column vector and a (2i)-th column vector of the plurality of column vectors, i being one of 1 to k, k being a number of data bits in each of the sub data units; and apply the first sub check matrix to the main data in the read codeword in response to a least significant bit (LSB) of a row address of the address being a low level.

16. The semiconductor memory device of claim 14, wherein:

the parity check matrix includes a plurality of column vectors divided into a plurality of code groups corresponding to the sub data units and the parity data;

the error correction circuit includes an ECC decoder configured to apply the different syndromes to the single bit error and the two bit errors based on the read codeword;

the ECC decoder is configured to, generate a second sub check matrix by performing an exclusive OR operation on a (2i)-th column vector and a (2i+1)-th column vector of the plurality of column vectors, i being one of 1 to k, k being a number of data bits in each of the sub data units; and apply the second sub check matrix to the main data in the read codeword in response to a least significant bit (LSB) of a row address of the address being a high level.

17. The semiconductor memory device of claim 11, wherein the error correction circuit includes an ECC decoder configured to apply the different syndromes to the single bit error and the two bit errors based on the read codeword;

wherein the ECC decoder includes:

a syndrome generation circuit configured to generate a first syndrome, a second syndrome and a third syndrome based on the parity check matrix and the read codeword, and configured to generate a selection signal based on the first syndrome, a least significant bit (LSB) of a row address of the address and one of the second syndrome and the third syndrome;

a first corrector configured to correct the single bit error in the main data based on the first syndrome to provide a first output data;

a second corrector configured to correct the two bit errors in the main data based on the second syndrome in response to the LSB of a row address being a low level to provide a second output data;

a third corrector configured to correct the two bit errors in the main data based on the third syndrome in response to the LSB of the row address being a high level to provide a third output data; and a selection circuit configured to select one of the main data, the first output data, the second output data and the third output data in response to the selection signal and the LSB of the row address to provide a corrected main data or the main data.

18. The semiconductor memory device of claim 11, comprising:

at least one buffer die; and a plurality of memory dies, the plurality of memory dies being stacked on the at least one buffer die and conveying data through a plurality of through silicon via (TSV) lines, and wherein at least one of the plurality of memory dies includes the memory cell array and the error correction circuit.

19. The semiconductor memory device of claim 18, wherein:

the error correction circuit is configured to generate transmission parity data based on transmission data to be transmitted to the at least one buffer die; and the at least one buffer die includes a via error correction circuit configured to correct transmission error included in the data conveyed through the silicon via (TSV) lines, based on the transmission parity data.

20. A semiconductor memory device, comprising:

a memory cell array including a plurality of volatile memory cells connected to word-line and bit-lines;

an error correction circuit configured to:

generate, based on a main data, a parity data using an error correction code (ECC) represented by a generation matrix and configured to store a codeword including the main data and the parity data in a target page of the memory cell array;

read the codeword from the target page as a read codeword based on an address provided from outside the semiconductor memory device to generate different syndromes based on the read codeword and a parity check matrix which is based on the ECC, and apply the different syndromes to the main data in the read codeword to correct a single bit error when the single bit error exists in the main data or to correct two bit errors when the two bit errors occur in adjacent two memory cells in the target page; and a control logic circuit configured to control the error correction circuit based on a command and the address from outside the semiconductor memory device, wherein the error correction circuit includes an ECC decoder configured to generate the different syndromes based on a parity check matrix which is based on the ECC, and wherein the ECC decoder is configured to generate a first sub check matrix and a second sub check matrix, and configured to apply one of the first sub check matrix and the second sub check matrix to the read codeword based on a least significant bit (LSB) of a row address of the address and to generate at least one syndrome for correcting the two bit errors.

* * * * *